US012614844B2

(12) United States Patent
Zhou et al.

(10) Patent No.: US 12,614,844 B2
(45) Date of Patent: Apr. 28, 2026

(54) PHOTONICALLY STEERED IMPEDANCE SURFACE ANTENNAS

(71) Applicant: Intel Corporation, Santa Clara, CA (US)

(72) Inventors: Zhen Zhou, Chandler, AZ (US); Tae Young Yang, Portland, OR (US); Timo Huusari, Hillsboro, OR (US); Renzhi Liu, Portland, OR (US); Wei Qian, Walnut, CA (US); Mengyuan Huang, Cupertino, CA (US); Jason Mix, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 638 days.

(21) Appl. No.: 17/957,752

(22) Filed: Sep. 30, 2022

(65) Prior Publication Data

US 2024/0120651 A1 Apr. 11, 2024

(51) Int. Cl.
| | |
|---|---|
| *H01L 23/66* | (2006.01) |
| *H01L 23/498* | (2006.01) |
| *H01Q 3/26* | (2006.01) |

(52) U.S. Cl.
CPC ..... *H01Q 3/2676* (2013.01); *H01L 23/49827* (2013.01); *H01L 23/66* (2013.01); *H01L 2223/6677* (2013.01)

(58) Field of Classification Search
CPC .................................. H01Q 3/01; H01Q 15/02
See application file for complete search history.

(56) References Cited

U.S. PATENT DOCUMENTS 8,605,004 B2 * 12/2013 Legare ..................... H01Q 3/24
343/810

FOREIGN PATENT DOCUMENTS

| CN | 106571515 A | | 4/2017 | |
|---|---|---|---|---|
| CN | 106571515 B | * | 5/2019 | ............. H01Q 1/364 |
| CN | 113363710 A | * | 9/2021 | ........... H01Q 21/061 |

OTHER PUBLICATIONS

Fong et al., "Scalar and Tensor Holographic Artificial Impedance Surfaces," IEEE, IEEE Transactions on Antennas and Propagation, vol. 58, No. 10, Oct. 6, 2010, 10 pages.

(Continued)

*Primary Examiner* — Dameon E Levi
*Assistant Examiner* — David Andrew Kubera
(74) *Attorney, Agent, or Firm* — Hanley, Flight & Zimmerman, LLC

(57) ABSTRACT

Photonically steered impedance surface antennas are disclosed. A disclosed example apparatus includes a semiconductor substrate to be communicatively coupled to a radio frequency (RF) source, an at least partially transparent dielectric layer, the semiconductor substrate at a first side of the at least partially transparent dielectric layer, an at least partially transparent conductive film at a second side of the at least partially transparent dielectric layer that is opposite the first side of the at least partially transparent dielectric layer, and an illumination source to illuminate at least a portion of the semiconductor substrate to generate a photoinduced solid-state plasma pattern that beam steers an RF signal corresponding to the RF source.

23 Claims, 19 Drawing Sheets

(56)     References Cited

OTHER PUBLICATIONS

Gallacher et al., "Optical Modulation of Millimeter-Wave Beams Using a Semiconductor Substrate," IEEE, IEEE Transactions on Microwave Theory and Techniques, vol. 60, No. 7, Jul. 26, 2012, 9 pages.

Stevenson et al., "Metamaterial Surface Antenna Technology: Commercialization through Diffractive Metamaterials and Liquid Crystal Display Manufacturing," 10th International Congress on Advanced Electromagnetic Materials in Microwaves and Optics—Metamaterials 2016, Sep. 17, 2016, 3 pages.

Hindle, "Comprehensive Survey of Commercial mmWave Phased Array Companies," Microwave Journal, Jan. 15, 2020, 8 pages.

Jakoby et al., "Microwave Liquid Crystal Enabling Technology for Electronically Steerable Antennas in SATCOM and 5G Millimeter-Wave Systems," MDPI, Crystals 2020, vol. 10, Jun. 16, 2020, 56 pages.

* cited by examiner

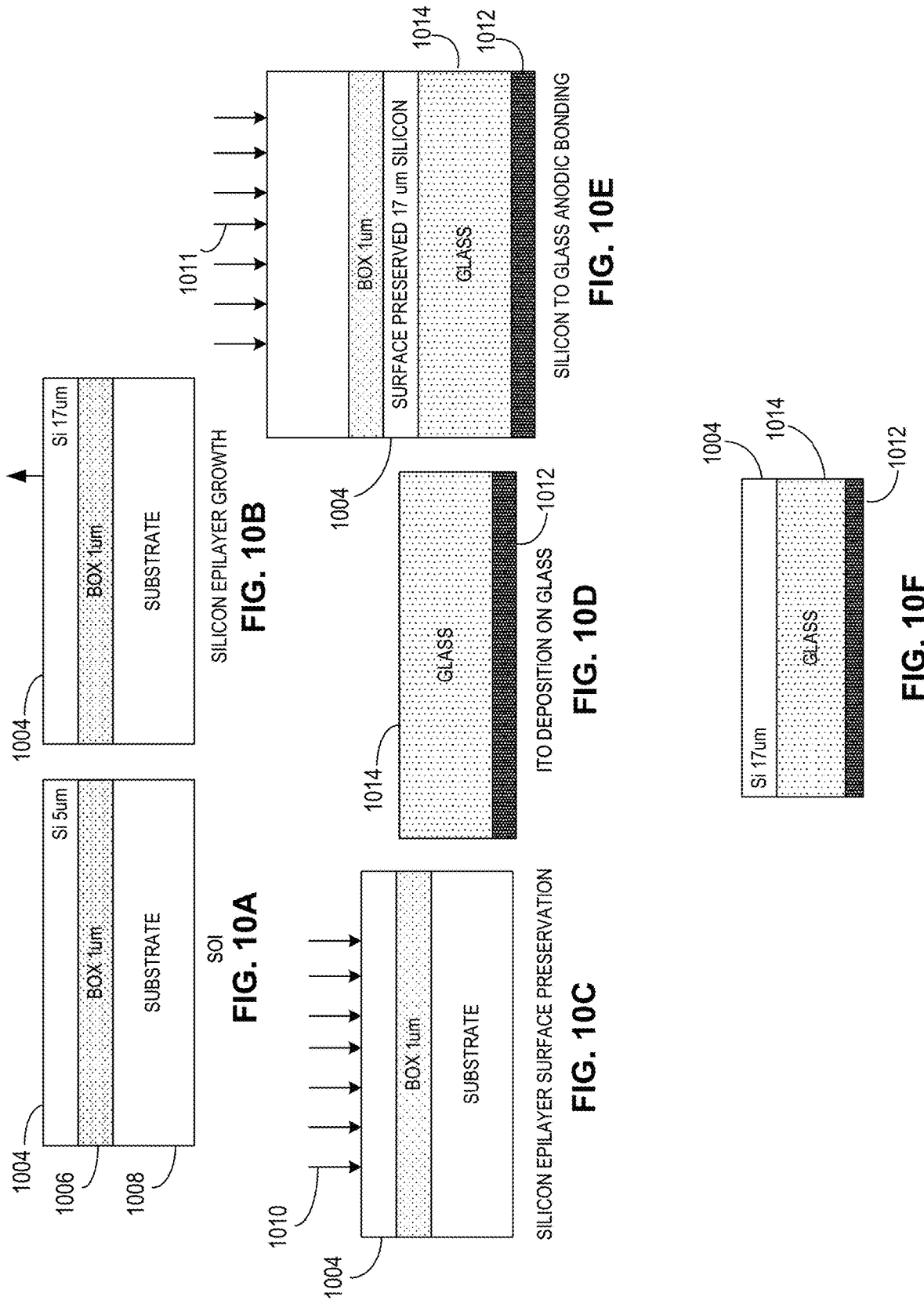

2200

| | |
|---|---|
| PROCESSING DEVICE 2202 | COMMUNICATION CHIP 2212 |
| MEMORY 2204 | BATTERY/POWER 2214 |
| DISPLAY DEVICE 2206 | GPS DEVICE 2218 |
| AUDIO OUTPUT DEVICE 2208 | AUDIO INPUT DEVICE 2224 |
| OTHER OUTPUT DEVICE 2210 | OTHER INPUT DEVICE 2220 |

ANTENNA 2222

PHOTONICALLY STEERED IMPEDANCE SURFACE ANTENNAS

FIELD OF THE DISCLOSURE

This disclosure relates generally to beam steering antenna systems and, more particularly, to photonically steered impedance surface antennas.

BACKGROUND

Beam steering is commonly utilized in antennas, radar sensors (e.g., radar sensors used by the robots in a smart factory setting), gesture recognition, and wireless communications, etc. Typically, to generate a desired radiation pattern, a phase and an amplitude of a field are controlled in regard to an aperture. For example, Fourier optics can provide a quantitative connection between a spatial distribution of an aperture field and an angular distribution of a far-field radiation pattern. The phase can play a more dominant role than magnitude in determining the far field radiation pattern.

BRIEF DESCRIPTION OF THE DRAWINGS

FIGS. 10A-10F depict an example process to produce examples disclosed herein.

Figure 1:
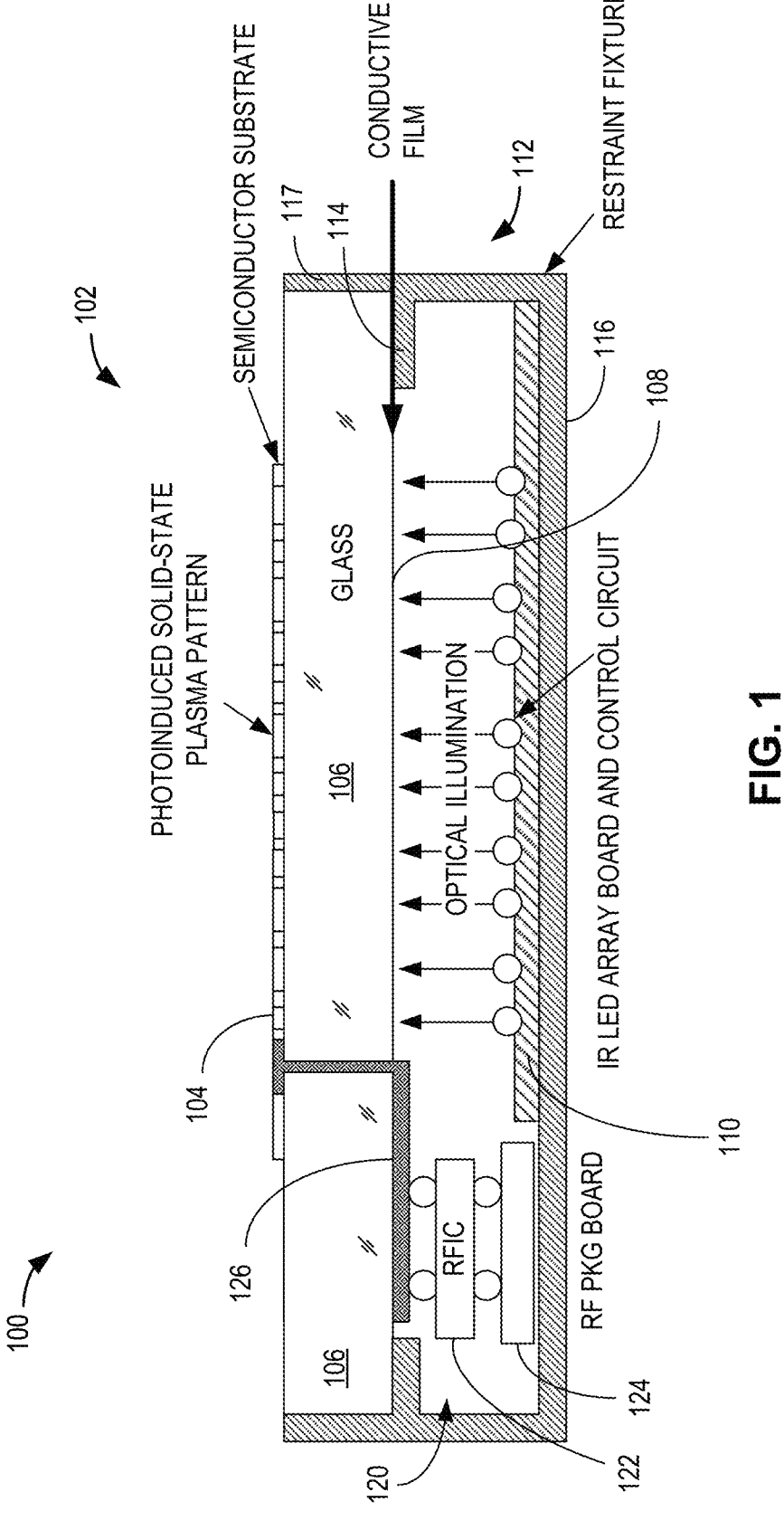
FIG. 1 is a cross-sectional view of an example photonically steered antenna in according with teachings of this disclosure.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real world delays for computing time, transmission, etc. Thus, unless otherwise specified, "substantially real time" refers to real time+/−1 second.

As used herein, the phrase "in communication," including variations thereof, encompasses direct communication and/ or indirect communication through one or more intermediary components, and does not require direct physical (e.g., wired) communication and/or constant communication, but rather additionally includes selective communication at periodic intervals, scheduled intervals, aperiodic intervals, and/ or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

Photonically steered impedance surface antennas are disclosed. Existing beam steering technologies, such as a phase array, metamaterial and metasurface arrays, reconfigurable reflect arrays, and reconfigurable transmission arrays manipulate and/or control a phase of each radiation element to form a controlled radiation pattern. However, these known implementations often involve a significant number of components, such as phase shifters, varactor diodes, switches, etc. In particular, these components can impose problems including relatively high power consumption, significant design and integration complexity, as well as relatively high interference with a radiating wave. Additionally, these known implementations can be relatively difficult to scale up or scale down with an antenna operational frequency and/or an antenna aperture size.

Examples disclosed herein utilize a photonically controlled holographic artificial impedance surface antenna system that can effectively and accurately control beam steering of a radio frequency (RF) signal. In particular, a semiconductor substrate defines a photoinduced solid-state plasma pattern when illuminated by an optical source (e.g., an illumination source), such as a light array (e.g., a grid of light sources). As a result, the RF signal emitted from a plane and/or surface of the semiconductor substrate is optically beam steered. In other words, parameters related to an aperture of the antenna transmitting the RF signal can be varied based on controlled illumination of the semiconductor substrate. The beam steering effects of the aforementioned photoinduced solid-state plasma pattern can be adjustable based on changing aspects of the light projected on the semiconductor substrate by varying portions of the solid-state plasma pattern that are illuminated, for example. Examples disclosed herein are cost-effective and can be manufactured and/or fabricated with relative ease. Further, examples disclosed herein have relatively less insertion loss than known implementations.

According to examples disclosed herein, the photonically controlled holographic artificial impedance surface antenna system includes a semiconductor substrate that defines a solid-state plasma pattern when at least portions thereof are provided with photonic energy. According to examples disclosed herein, the semiconductor substrate is coupled to a first side of a dielectric substrate that is at least partially transparent to infrared (IR) light, such as glass, for example. In turn, the dielectric substrate is coupled to an at least partially transparent conductive layer, film and/or substrate (e.g., a conductive thin film) at a second side of the dielectric substrate opposite the first side. According to examples disclosed herein, the aforementioned optical source, which can be implemented as a light emitting diode (LED) or laser array, is utilized to illuminate the conductive substrate and, in turn, the at least partially transparent dielectric substrate along with the semiconductor substrate, thereby causing the semiconductor substrate to generate the solid-state plasma pattern. As a result, the solid-state plasma pattern acts as a holographic artificial impedance surface for beam steering. In other words, a surface (e.g., an outer surface, an upper surface, etc.) of the semiconductor substrate changes its state from semiconductor to a solid-state plasma state, thereby acting as a surface wave launcher when at least partially illuminated by the optical source.

In some examples, the electrically conductive layer is at least partially composed of indium tin oxide (ITO) or any other appropriate electrically conductive partially transparent material. In some examples, the semiconductor substrate includes silicon and/or germanium. In some examples, a restraint fixture (e.g., a fabricated restraint fixture) supports, positions and/or aligns the semiconductor substrate, the dielectric substrate, the conductive film/layer and the optical source. In some such examples, a gap (e.g., an air gap, a vacuum gap, etc.) is defined between the conductive film/layer, which is coupled to the dielectric substrate, and the optical source. In some examples, a two-dimensional (2-D) grid of light sources (e.g., LEDs, lasers in an array arrangement, etc.) is utilized to illuminate the semiconductor substrate to generate and/or define the solid-state plasma pattern. In some such examples, ones of the grid of light sources can emit light (e.g., turned on) to change an illumination of the semiconductor substrate and, thus, change parameters of the solid-state plasma pattern, thereby varying parameters and/or a degree of beam steering therefrom. In some other examples, a single laser with a programmable optical equalizer (e.g., optical equalization device) that is controlled by a digital holograph can be utilized. However, any other appropriate illumination technology can be implemented instead.

In some examples, a radio frequency (RF) source, such as a radio frequency integrated circuit (RFIC), is utilized to provide and/or transmit a signal to the semiconductor substrate defining the solid-state plasma pattern so that the signal can be photonically beam steered. In some such examples, the RFIC can be communicatively and/or electrically coupled to the semiconductor substrate with a through-via that extends through at least a portion of the dielectric substrate. In some examples, the semiconductor substrate is subdivided into pixels of a grid defined thereon such that different ones of the pixels are illuminated to vary parameters of beam steering the RF signal.

As used herein, the term "semiconductor substrate" refers to a material, layer, component and/or device that includes semiconductor material that changes its state from a semiconductor state to a solid-state plasma state. As used herein, the term "partially transparent" refers to a material, layer, component and/or device that enables light, such as IR light, to pass therethrough.

FIG. 1 is a cross-sectional view of an example photonically steered antenna 100 in according with teachings of this disclosure. The photonically beam steered antenna 100 of the illustrated example includes a photonic beam steering device 102 which, in turn, includes a semiconductor substrate 104, an at least partially transparent dielectric substrate (e.g., an at least partially transparent dielectric layer) 106, an electrically conductive thin film (e.g., a thin film ground layer, a conductive film, etc.) 108, an optical source (e.g., an illumination source, a light array, etc.) 110, and a fixture (e.g., a restraint fixture) 112. In turn, the example fixture 112 includes a ledge 114, a base 116, and a side wall 117. In this example, the photonic beam steering device 102 includes and/or is communicatively coupled to a radio frequency (RF) device (e.g., an RF source) 120 which, in turn, includes an RF board (e.g., an RF printed circuit board) 124 and a radio frequency integrated circuit (RFIC) 122 (or other RF source). However, any appropriate configuration to transmit RF signals can, instead, be implemented. In some examples, the RF device 120 and/or the RFIC 122 are communicatively coupled to the semiconductor substrate 104 by a through-glass via 126 that extends through at least a portion of the substrate 106. However, any via in an IR transparent substrate can be implemented instead.

In operation, the example RFIC 122 transmits and/or provides an RF signal to the semiconductor substrate 104 via the dielectric substrate 106, which is generally shaped as a plane that extends along left and right directions, as well as into and out of the page, of FIG. 1. In the illustrated example, the RFIC 122 provides an RF signal to the semiconductor substrate 104 for transmitting from a surface and/or plane defined by the semiconductor substrate 104. In this example, the semiconductor substrate 104 defines and/or generates a photoinduced solid-state plasma pattern in response to portions thereof being illuminated by the optical source 110. In particular, both the dielectric substrate 106 and the conductive thin film 108 are at least partially transparent (e.g., at least partially transparent to IR signals, fully transparent to IR signals, etc.) such that light emitted from the optical source 110 can illuminate and/or provide incident light to at least a portion(s) of the semiconductor substrate 104. To that end, in some examples, a sapphire substrate which has an optical transparent window within 0.25 to 4.25 lam can be utilized.

As a result of the semiconductor substrate 104 being illuminated by light that travels through the dielectric substrate 106, the RF signal provided by the RFIC 124 to the semiconductor substrate 104 is photonically beam steered. In other words, the generation of the photoinduced solid-state plasma pattern of the semiconductor substrate 104 from light (e.g., IR light) passing though the conductive thin film 108 and the substrate 106 causes the RF signal to launch a surface wave propagating along the photoinduced solid-state plasma pattern, thereby generating a controlled far field radiation pattern.

In this example, the solid-state plasma pattern is introduced in the semiconductor substrate 104 through photonic absorption and, as a result, the semiconductor substrate 104 acts as a metallic holographic artificial impedance surface for beam steering. In particular, the example semiconductor substrate 104 functions as a surface wave launcher. The surface wave launched from the semiconductor substrate 104 radiates by propagating along an interface of the dielectric substrate 106 and the solid-state plasma enabled semiconductor substrate 104. The example packaged RFIC 122 may be coupled and/or attached to the dielectric substrate 106, as shown in FIG. 1, to provide the driving signal to the aforementioned surface wave launcher of the semiconductor substrate 104.

To photonically steer the RF signal, examples disclosed herein include excessive carriers in the semiconductor substrate 104 to change its state from semiconductor to a solid-state plasma state. According to some examples, the excessive carriers change the state of the semiconductor substrate 104 through an in-band optical absorption process, which is governed by Lambert's law of photon absorption as shown in Equation 1 below:

$$G(x) = \frac{(1 - R_{opt})N_{opt}}{A} \alpha_{\lambda opt} e^{-\alpha_{\lambda opt} x}, \tag{1}$$

where G is the carrier generation rate through optical in-band absorption, $R_{opt}$ is the optical reflectivity of the semiconductor at the given wavelength $\lambda_{opt}$, $N_{opt}$ is the number of incident photons, A is the cross-sectional area, $\alpha_{\lambda opt}$ is the optical absorption coefficient with a unit of $cm^{-1}$ at a given wavelength $\lambda_{opt}$, and x is the depth of incident light penetration. Further, the photon energy E can be calculated based on Equation 2 below:

$$E = hv = \frac{hc}{\lambda}, \tag{2}$$

where h is Planck's constant (4.1354e-15 eV/s) and vis the frequency of the incident light, c is the speed of light, and $\lambda$ is the light wavelength. The number of incidental photons is related to the optical intensity $I_{opt}$ and the cross-sectional area A as shown in Equation 3 below:

$$N_{ph} = \frac{I_{opt} * A}{E} = \frac{I_{opt} * A * \lambda}{hc} \tag{3}$$

According to examples disclosed herein, with a generation rate defined as the ratio of excessive carrier density versus the effective carrier lifetime as $\Delta n/\tau_{eff}$, with algebraic manipulation of example Equation 1, an excessive carrier density can be calculated according to example Equation 4 below:

$$\Delta n(x) = (1 - R_{opt})\frac{I_{opt}\lambda\alpha_{\lambda opt}}{hc}\tau_{eff}e^{-\alpha_{\lambda opt}x} \tag{4}$$

In some examples, to achieve a desired excessive carrier density with an associated power consumption, a wavelength of the optical source, $\lambda$, can be selected based on its corresponding photon energy, absorption coefficient, and reflection coefficient of a semiconductor material at that specific wavelength. Further, an effective lifetime, $t_{eff}$, can be selected to increase (e.g., maximize) an excessive carrier density for a given optical source while balancing power efficiency and a switching time of the solid-state plasma to semiconductor state.

In some examples, to enable a reasonable conductor loss, experimental data has indicated that the excessive carrier density over $10^{18}$/cm$^3$ can be utilized (based on experiments). In some such examples, parameters and/or designs are based on an assumption that the excessive carrier density is equal to approximately $10^{18}$/cm$^3$, which can be achieved through photonic absorption, for example. Example Equation 5 below can be utilized to determine a distance and/or a surface thickness corresponding to a semiconductor substrate:

$$\delta = \sqrt{\frac{2\rho}{2\pi f \mu_r \mu_0}}, \tag{5}$$

where $\rho$=resistivity (ohm-meters), f=frequency (Hz) and $\mu_0$=4$\pi$*10$^{-7}$ (Henries/meter). The example Equations 1 through Equation 5 shown above are only examples and any other appropriate relationships and/or calculations can be implemented instead.

In this example, the semiconductor substrate 104 is at least partially composed of (e.g., fully composed of) or includes silicon. Additionally or alternatively, the semiconductor substrate 104 can include germanium or any other semiconductor materials like common III-V allows including, but not limited to indium phosphide (InP), gallium arsenide (GaAs), or silicon carbide (SiC), etc. Further, in the illustrated example, the conductive thin film 108 is at least partially transparent to light (e.g., IR light) and functions as a ground plane of the photonically beam steered antenna 100. In this example, the thin film 108 is composed of ITO or any other IR transparent conductive thin film including, but not limited to indium-doped cadmium seleniden (IT/CdSe) that is at least partially transparent, for example. In some examples, the dielectric substrate 106 is composed of glass. However, any other appropriate at least partially transparent materials can instead be utilized.

To position and/or support components of the example photonically beam steered antenna 100 of FIG. 1, the restraint fixture 112 positions the optical source 110 relative to a side of the dielectric substrate 106 having the conductive thin film 108 deposited thereon. In particular, the conductive thin film 108 and the optical source 110 are separated by a gap (e.g., an air gap, a vacuum gap, etc.) therebetween. Further, the example restraint fixture 112 includes the ledge 114 to support the conductive thin film 108 and/or at least a portion of the substrate 106. The example restraint fixture 112 also includes the base 116 to support the optical source 110 and/or the RF package board 124, as well as the side wall (e.g., a lateral side wall) 117 to laterally align the substrate 104 and the substrate 106 relative to the optical source 110 (along a horizontal direction depicted in FIG. 1).

As mentioned above, examples disclosed herein enable effective photonic beam steering of RF signals via a photonically controlled holographic artificial impedance surface antenna system. However, examples disclosed herein can be applied to any appropriate application of photonic beam steering at any appropriate size, scale, power level, frequency, etc.

Figures 2A, 2B:
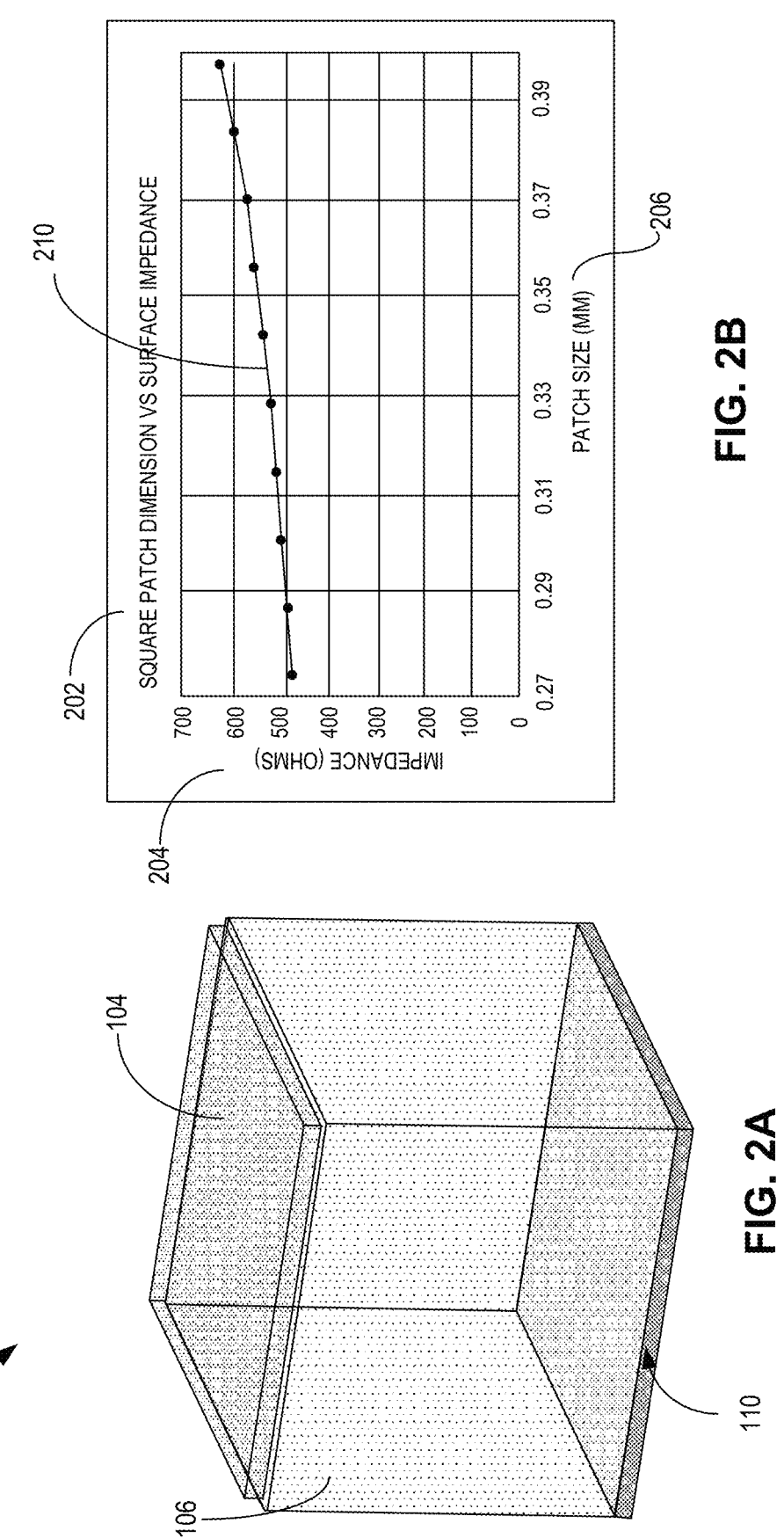
FIG. 2A depicts an isometric view of an example portion of the example photonically steered antenna of FIG. 1.
FIG. 2B depicts an example graph that relates surface impedance to patch dimensions.

FIG. 2A depicts an isometric view of an example portion of the example photonically steered antenna 100 of FIG. 1. In particular, a discretized portion (e.g., a divided block or section) of the example photonically steered antenna 100 is shown. As can be seen in the illustrated example of FIG. 2A, the semiconductor substrate 104 is depicted coupled to the least partially transparent dielectric substrate 106, which at least partially transparent to light and/or IR light in this example, at a first side of the dielectric substrate 106. Further, the electrically conductive thin film 108 is shown coupled to the at least partially transparent dielectric substrate 106 at a second side of the dielectric substrate 106 opposite to the first side.

In this example, a holographic artificial impedance surface of the semiconductor substrate 104 is formed by a two-dimensional (2-D) array of unit cells. Each unit cell has a photoinduced induced patch (PIP) in the semiconductor substrate 104 depicted above the dielectric substrate 106 in the view shown in FIG. 2A. In some specific examples, a photoinduced induced square patch (PISP) is utilized. However, the PIP can be any appropriate shape including, but not limited to, circular, rectangular, slits or no slits, etc.

Turning to FIG. 2B, an example graph 202 is shown. The example graph 202 includes a vertical axis 204 corresponding to impedance in ohms (Q) while a horizontal axis 206 corresponds to a patch size in millimeters (mm). As can be seen in the graph 202, a curve 210 indicates that impedance can increase with a patch size and/or an area of the patch. In other words, a size of a PIP can control the impedance as shown in FIG. 2B, thereby resulting in a phase delay of surface wave propagating through a unit cell. According to examples disclosed herein, the size of the PIP can be adjusted to vary impedance of an RF signal at any given lateral position (x-direction and y-direction). In other words, examples disclosed herein can control RF aperture characteristics based on controlling the PIP.

Figures 2C, 2D:
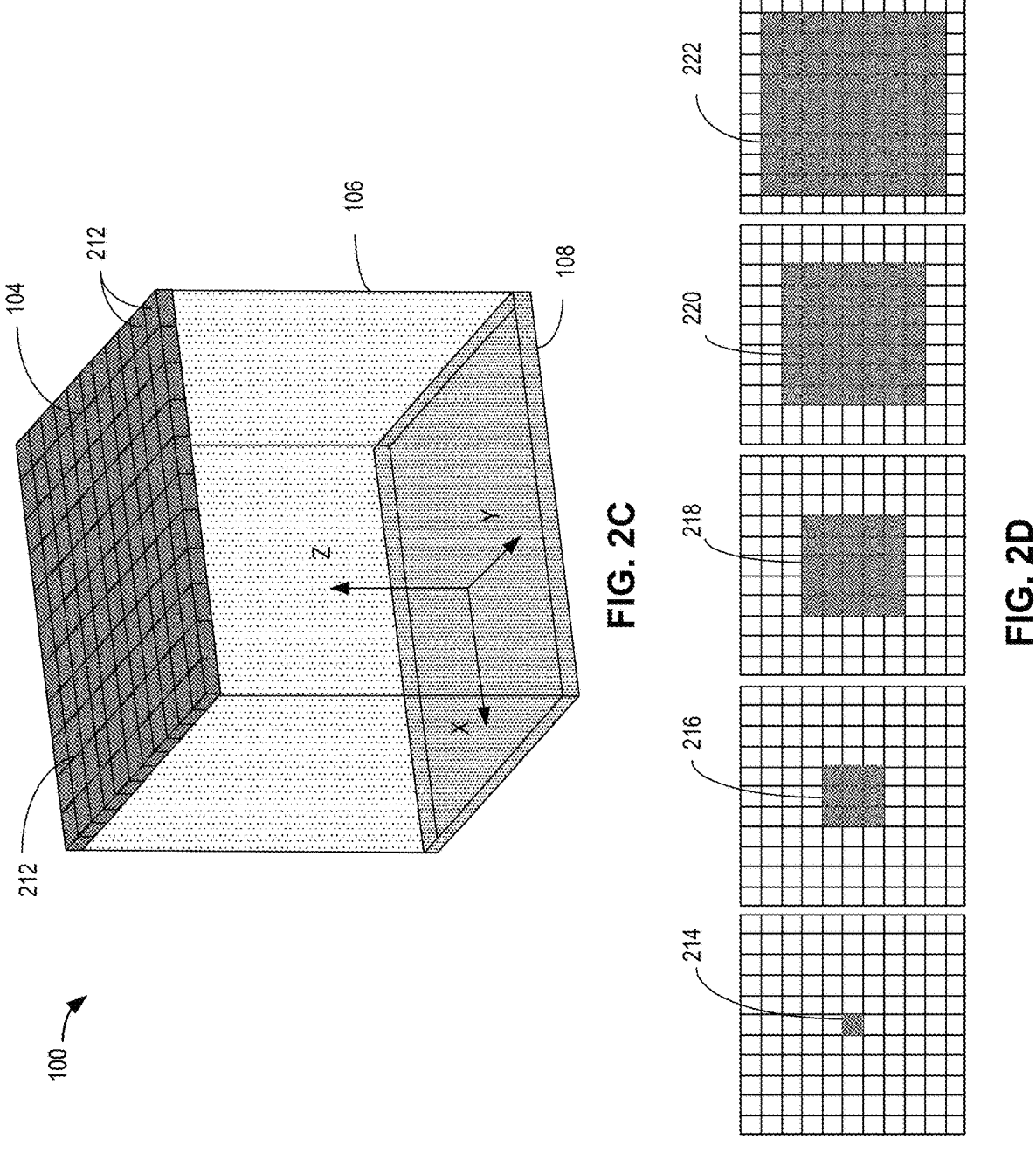
FIG. 2C depicts an example portion of the example photonically steered antenna of FIG. 1.
FIG. 2D depicts example light array patterns that can be implemented in examples disclosed herein.

FIG. 2C depicts an example portion of the example photonically steered antenna 100 of FIG. 1. In the illustrated example of FIG. 2C, the semiconductor substrate 104 is sub-divided into an array corresponding to a pixelated unit cell having example discrete pixels (e.g., pixel portions or sections) 212. In turn, the discrete pixels 212 can be illuminated according to shapes (e.g., a wave-like shape, a shape resembling propagating waves, etc.) and/or patterns (e.g., 2-D patterns) to control, define and/or configure aspects/parameters of beam steering. Additionally or alternatively, the discrete pixels can be illuminated in groups/groupings. In some such examples, the groups/grouping of the pixels can be predefined according to beam steering settings.

To configure (e.g., dynamically configure) the size of the PIP (or any other aspect of the PIP), examples disclosed herein pixelate the semiconductor substrate 104 into a 2-D pixel array as shown in FIG. 2C. In particular, illumination of the semiconductor substrate 104 is segregated based on the 2-D pixel array. In this example, each of the pixels 212 can be illuminated by one or more LEDs (e.g., one or more infrared LEDs) and/or appropriate programmable optical source. In other words, different ones of the 2-D pixel array can be illuminated to define different images and/or light patterns projected onto the semiconductor substrate 104.

Turning to FIG. 2D, example light array patterns 214, 216, 218, 220, 222 that can be implemented in examples disclosed herein are depicted. The light array patterns 214, 216, 218, 220, 222 can correspond to portions of the semiconductor substrate 104 that are illuminated. By controlling illumination of groups and/or individual ones of the pixels 212 (e.g., by an LED array corresponding to the optical source 110) shown in FIG. 2C, characteristics of the PIP can be controlled. For example, a size and/or a shape of the PIP can be varied, as represented by the illuminated patterns corresponding to the photoinduced solid-state plasma pixels 212. As a result, a resultant surface impedance (e.g., a resultant impedance in three-dimensional (3D) space) of the semiconductor substrate 104 can be controlled, adjusted and/or changed, for example. In some other examples, an intensity and/or light output of the solid-state plasma pixels 212 is controlled (e.g., controlled with varying power output in addition to on and off states) for an increased degree of control over aspects of the PIP.

While the example of FIG. 2D depicts varying square patterns 214, 216, 218, 220, 222 of illumination, examples disclosed herein can correspond to any appropriately shaped pattern including, but not limited to pixel patterns that are rectangular, spiral-shaped, wave-shaped, cross-shaped, x-shaped, circular, ellipsoid, diamond-shaped, triangular, oblong, asymmetric, etc. Further, multiple square patterns can be utilized to defined much more complex shapes and/or outlines in the 2-D plane of the semiconductor substrate 104.

Figure 3:
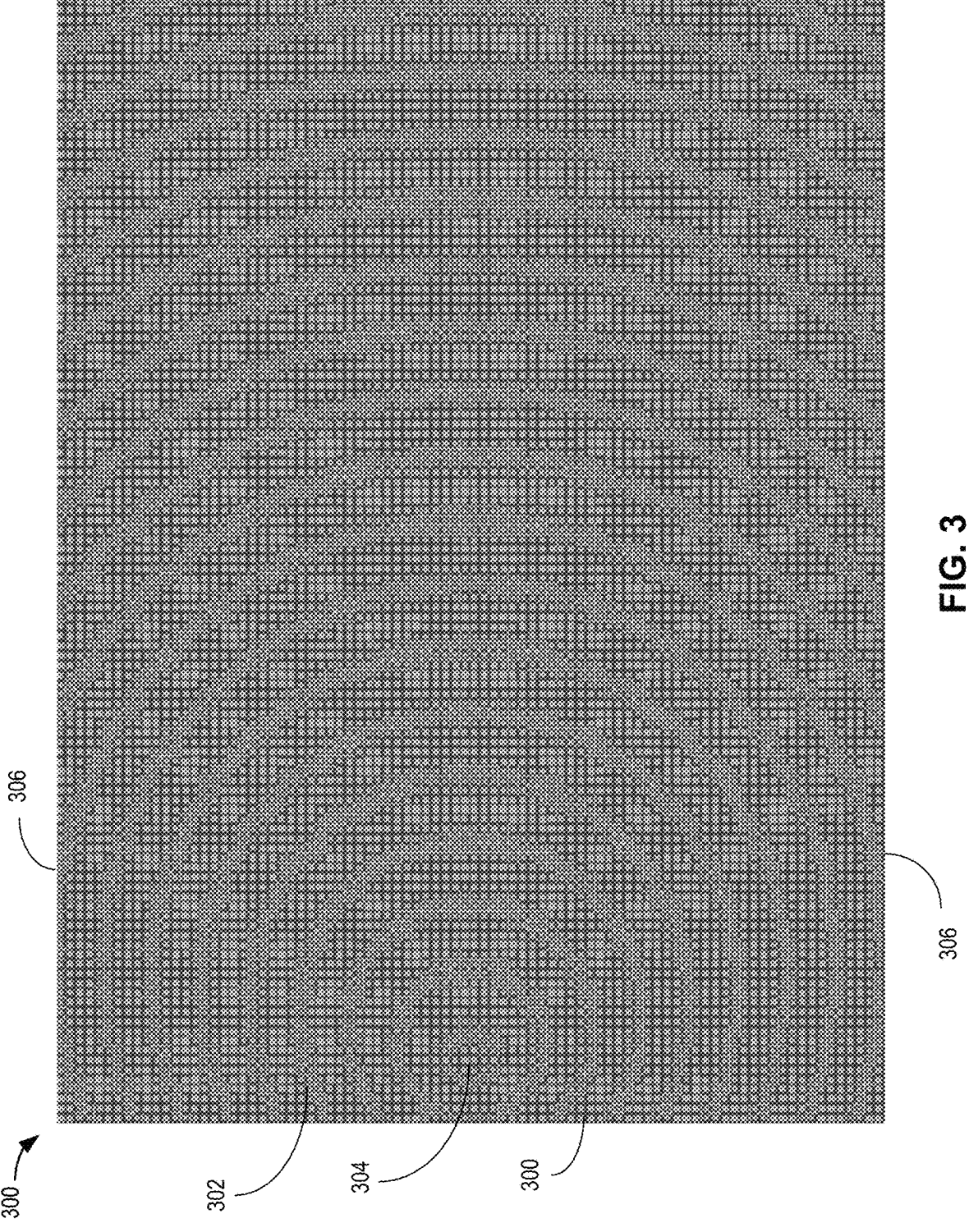
FIG. 3 illustrates an example solid-state plasma pattern that can be implemented in examples disclosed herein.

FIG. 3 illustrates an example solid-state plasma pattern 300 that can be implemented in examples disclosed herein. In this example, the pattern 300 is generated by illumination of portions of the semiconductor substrate 104 and resembles concentric and/or oblong waves, which may be regular or irregular. According to examples disclosed herein, the solid-state pattern 300 can be defined on an outwardly facing surface (e.g., an externally facing surface) of the semiconductor substrate 104. In the illustrated example of FIG. 3, ellipsoid, round or oblong waves 302 extend from a center 304. In this example, an extent of the pattern 300 is defined by edges 306. According to examples disclosed herein, a shape (e.g., a 2-D shape) of the waves 302 is defined based on selectively illuminating pixels, such as the pixels 212 described above in connection with FIG. 2C.

The example of the solid-state pattern 300 is only an example and any appropriate overall shape and/or wave pattern can be implemented instead. Further, any other pattern shape can, instead, be implemented.

Figure 4:
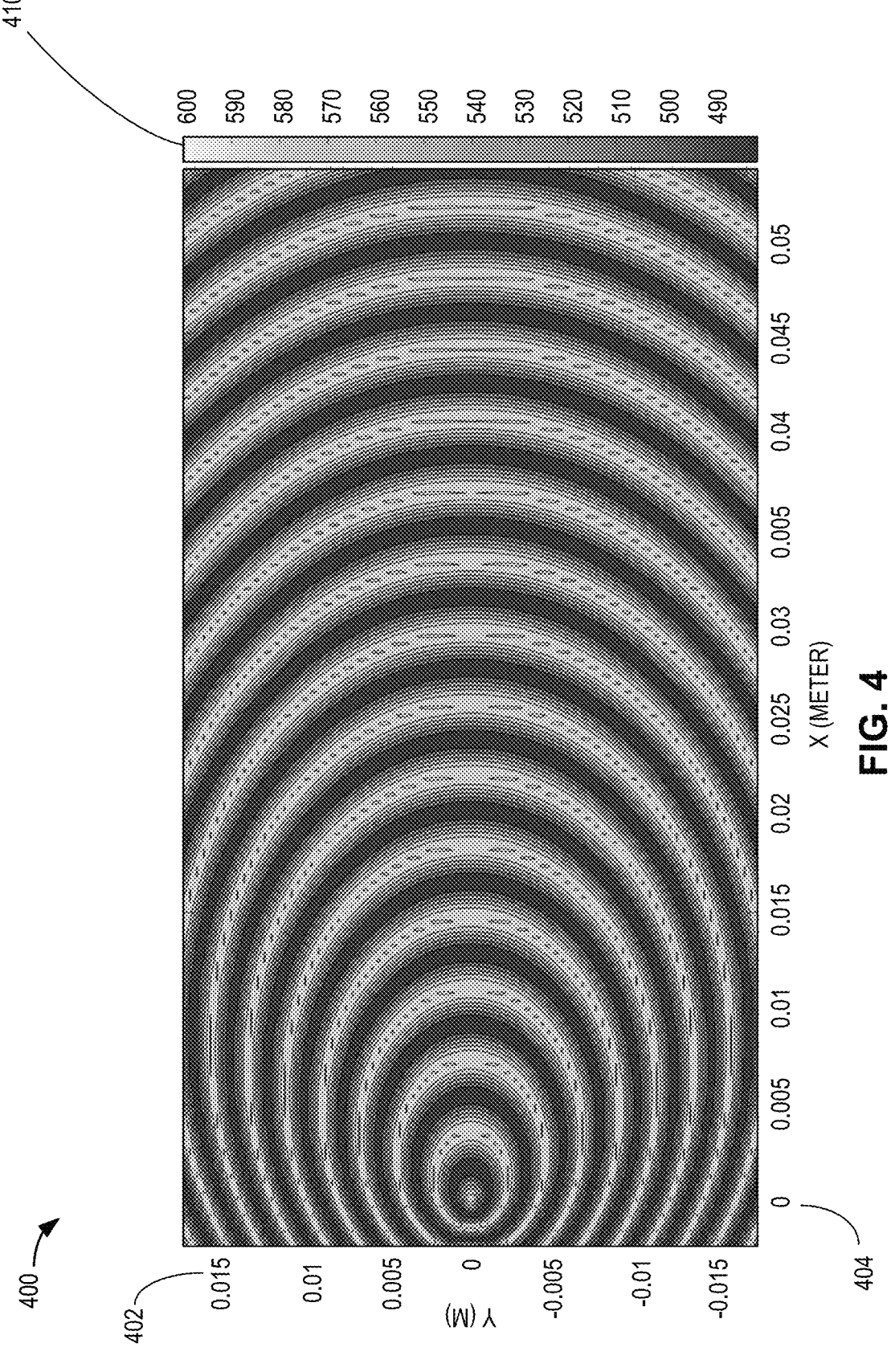
FIG. 4 depicts a surface impedance profile that can be implemented in examples disclosed herein.

FIG. 4 depicts a graph 400 of a surface impedance profile that can be implemented in examples disclosed herein. In particular, an example photoinduced reconfigurable holographic artificial impedance surface for beam scanning is shown. As demonstrated by example Equation 1 above, by interfering a surface wave with a desired radiating plane wave radiating along a pre-defined (e.g., specific) angle based on an optical holograph concept, a surface impedance profile can be calculated. The example of FIG. 4 depicts a surface impedance profile for steering a beam at an approximate angle of $\theta=20°$ and $\varphi=0$ at 78.5 gigahertz (GHz) with an approximately 17 micrometer ($\mu$m) thickness silicon substrate bonded to an approximately 0.3411 mm thickness glass substrate that is backed by an ITO layer. However, any other appropriate construction and/or thickness can, instead, be implemented. In the illustrated view of FIG. 4, the example graph 400 includes X and Y dimensions 402, 404 that are the length and width, respectively, of the holographic impedance surface, as well as a bar 410 that depicts the impedance in $\Omega$. In other words, a 3-D surface profile for impedance is generated by examples disclosed herein. The 3-D surface profile can be effectively controlled by varying the illumination of the semiconductor substrate 104, thereby enabling a wide range of adjustability of the beam steering.

Figures 5, 6:
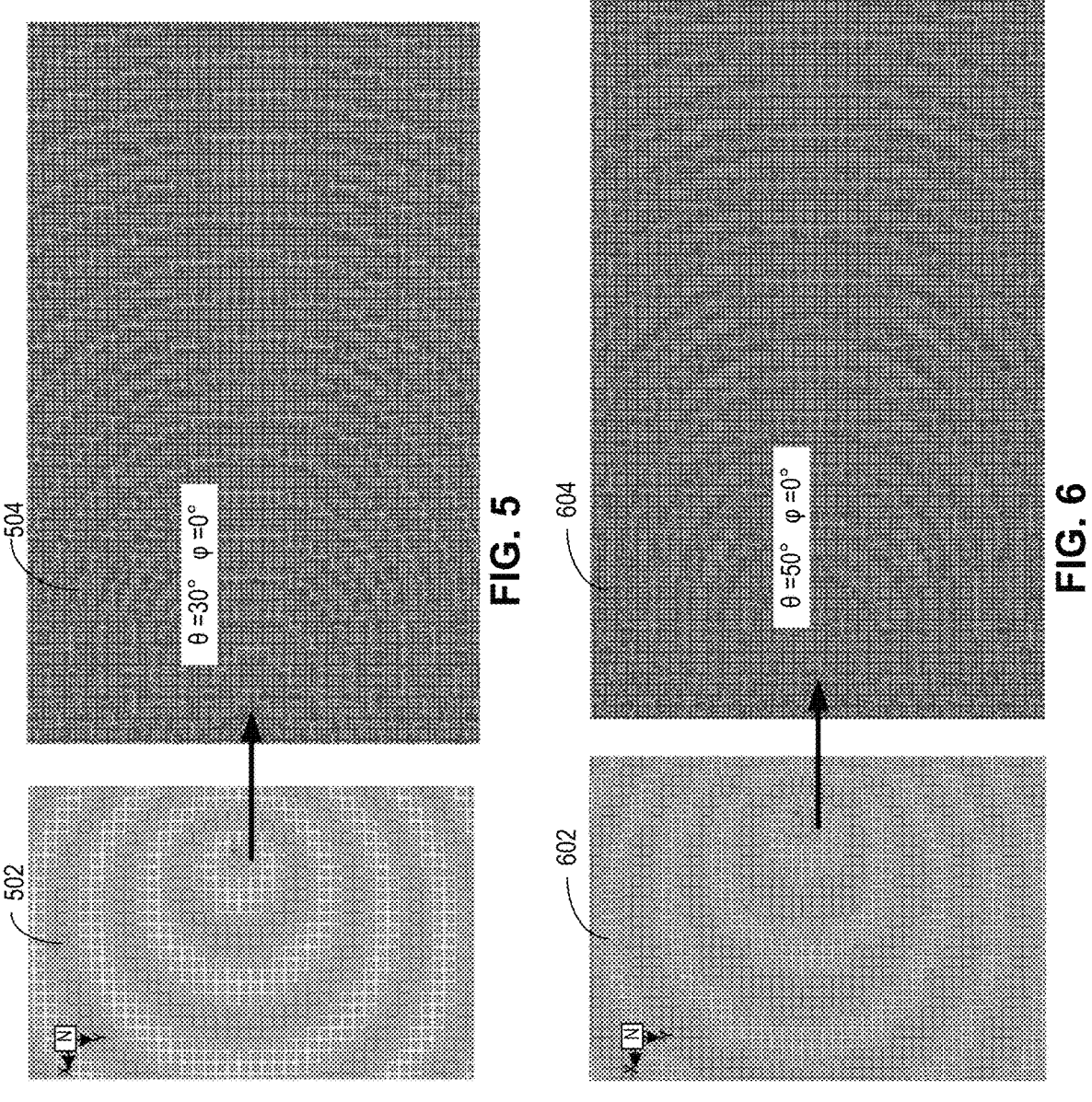
FIG. 5 depicts an example beam scanning pattern.
FIG. 6 depicts another example beam scanning pattern.

FIG. 5 depicts an example beam scanning pattern that can be implemented in examples disclosed herein. In this example, a physical implementation of a surface impedance profile is illustrated at approximately $\theta=30°$, $\varphi=0$ at 78.5 GHz. As can be seen in the illustrated example of FIG. 5, a detail 502 of an overall pattern 504 is shown. In the detail 502, an illumination pattern regarding individual cells is shown corresponding to the aforementioned beam steering parameters. The example detail 502 also depicts different sizes corresponding to PIPs and/or photoinduced patches for control of beam steering.

FIG. 6 depicts another example beam scanning pattern. In this example, a physical implementation of a surface impedance profile is illustrated at approximately $\theta=50°$, $\varphi=0$ at 78.5 GHz. Similar to the example of FIG. 5, an example detail 602 of an overall pattern 604 is shown.

Figure 7:
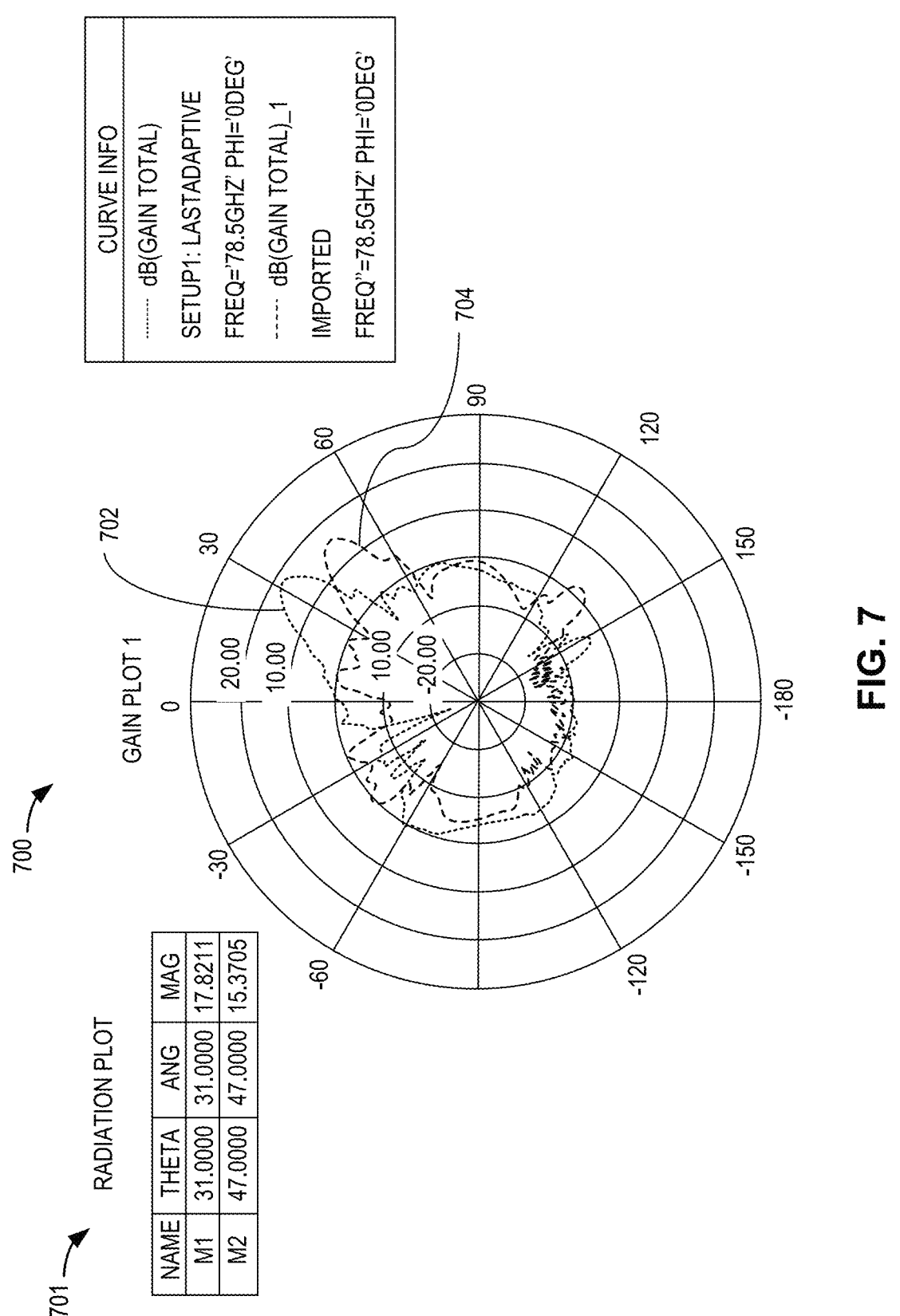
FIG. 7 depicts an example radiation plot according to examples disclosed herein.

FIG. 7 depicts an example radiation plot 700 according to examples disclosed herein. In this example, a table 701 represents some parameters corresponding to a first example pattern 702 and a second example pattern 704. In particular, the first example pattern 702, which is designated as "m1" in FIG. 7, illustrates a first pattern that is photonically beam steered with first parameters while the second example pattern 704, which is designated as "m2" in FIG. 7, is beam steered with second parameters different from the aforementioned first parameters. In this particular example, the first parameters correspond to a first optical array illumination pattern while the second parameters correspond to a second optical array illumination pattern different from the first optical array illumination pattern. In other words, examples disclosed herein can vary and control beam steering radiation patterns based on different illumination and/or illumination patterns emitted toward the semiconductor substrate 104.

As can be seen in the illustrated example of FIG. 7, the first example pattern 702 and the second example pattern 704 have similar energy/power signatures, but are generally offset in peak radiation angle from one another.

Figures 8, 9:
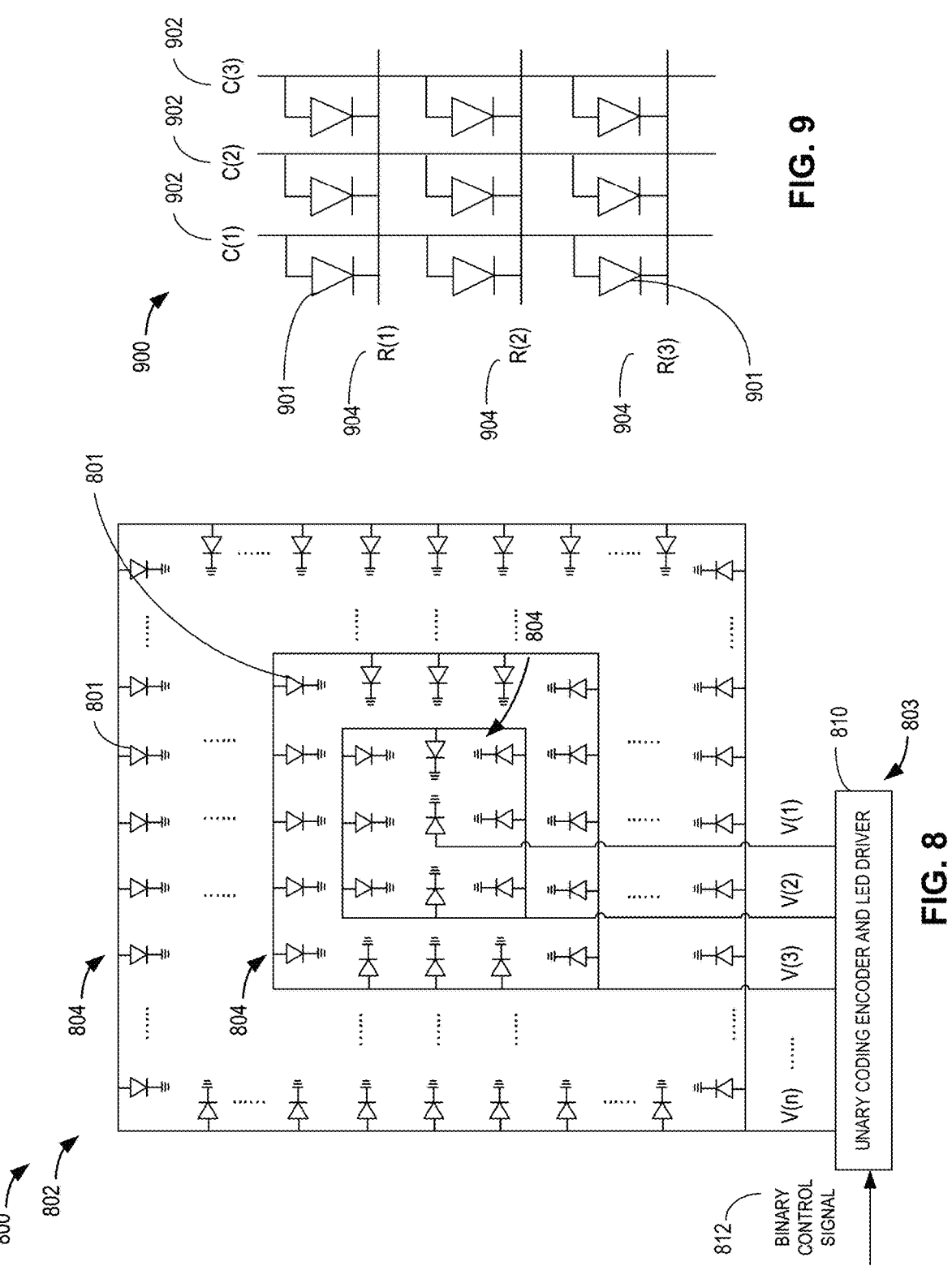
FIG. 8 depicts an example circuit that can be implemented in examples disclosed herein.
FIG. 9 depicts another example circuit that can be implemented in examples disclosed herein.

FIG. 8 depicts an example LED control circuitry 800 that can be implemented in examples disclosed herein. In this example, the LED control circuitry 800 supports temperature compensation and relatively low latency. In other words, examples disclosed herein can implement LED cells 801 arranged with a dedicated LED array 802 along with corresponding control circuitry 803 to support PISP reconfigurability with relatively low latency. In other words, examples disclosed herein can quickly adjust beam steering.

To drive an example PIP configuration, such as the example shown in FIG. 2D, the aforementioned example LED array 802 has been divided into groups 804 and within each of the groups 804, anodes of the LED cells 801 are connected together, as shown in the illustrated view of FIG. 8. In this example, the LED cells 801 of the corresponding groups 804 are arranged in a generally ring-like structure, and the LED cells 801 are controlled via an encoder driver 810 based on a binary control signal 812. In the illustrated example of FIG. 8, the LED cells 801 of the groups 804 are driven by a signal V(i), as denoted in FIG. 8. For example, where "n" is regarded to be an array size, when V(i) is set high (e.g., above a threshold voltage), the LED cells 801 within a ring corresponding to the group 804 are turned on, whereas when V(i) is set low (e.g., below a threshold voltage), corresponding ones of the LED cells 801 are turned off.

In the illustrated example of FIG. 8, multiple V(i) signals are set high together and/or simultaneously to construct an LED pattern (e.g., a square-shaped LED pattern). For example, to configure the PISP into the pattern shown in connection with the pattern 218 of FIG. 2D in which 5×5 LED cells are turned on, the control voltage V(1), V(2), V(3), are set high with remaining control voltage(s) set to low. Similarly, for the example pattern 222 in FIG. 2D, V(1), V(2), . . . , V(5) are set high with the remaining control voltage(s) set low. As a result, the example control scheme can convert binary control bits into unary coding. Specifically, in some examples, for the ith LED pattern, where (2i−1)×(2i−1) of the LED cells 801 are to be turned on, the unary coding encoder is converting binary number "i" into logic high for V(1), V(2), . . . , V(i), and logic low for V(i+1), V(i+2), . . . , V(n). In this example, a number "n" corresponds to the largest LED array size of (2n−1)×(2n−1), for example. To facilitate this conversion, a relatively simple unary coding encoder and LED driver block to generate those V(i) control signals can be implemented and, as a result of this relatively simple example control and encoding scheme, relatively low latency control of the LED array 802 can be achieved. However, any other appropriate circuit architecture can, instead, be implemented.

FIG. 9 depicts another example circuit 900 that can be implemented in examples disclosed herein. In contrast to the example circuit 800 described above in connection with FIG. 8, example LED cells 901 are arranged in columns 902 and corresponding rows 904, thereby defining a pattern by which any of the LED cells 901 can be individually driven with a provided voltage signal (e.g., a voltage signal above a voltage threshold). In other words, more complex illumination patterns can be utilized with the example circuit 900 in comparison to the example circuit 800 shown and described above in connection with FIG. 8. As a result, any 2-D pattern can be defined by individual ones of the LED cells 901 being illuminated (subject to resolution limits of the LED cells 901).

FIGS. 10A-10F depict an example process to produce examples disclosed herein. Turning to FIG. 10A, a substrate layer 1004, which is at least partially composed of silicon, is shown coupled to and/or adjacent a substrate 1006, which is at least partially composed of silicon dioxide ($SiO_2$), at a first side of the substrate 1006, for example. Further, a substrate (e.g., a silicon epilayer) 1008, which is at least partially composed of silicon, is shown coupled to the substrate 1006 at a second side of the dielectric substrate 1006 opposite the aforementioned first side.

FIG. 10B depicts a silicon epilayer growth process on the silicon substrate layer 1004. In this example, the silicon substrate layer 1004 is grown from 5 μm to 17 μm in thickness. However, any other appropriate growth parameters, growth process and/or thickness(es) can, instead, be implemented.

FIG. 10C depicts a surface preservation process and/or surface treatment process performed on the substrate layer 1004. In the illustrated example of FIG. 10C, an indicator 1010 corresponds to and/or includes an indication of a preservation process.

FIG. 10D depicts an at least partially transparent electrically conductive layer 1012 (e.g., a conductive thin film such as the conductive thin film 108 shown in FIG. 1) at least partially composed of ITO (or other transparent electrically conductive material) being deposited on an at least partially transparent dielectric substrate (e.g., a glass substrate with IR transmissivity, a clear material, etc.) 1014, which is an infrared transparent glass substrate in this example. However, any other appropriate methodology and/or process besides a deposition process can, instead, be implemented.

FIG. 10E depicts the silicon substrate layer 1004 being bonded and/or coupled to the dielectric substrate 1014. In this example, a silicon to glass anodic bonding is performed to couple the substrate layer 1004 to the dielectric substrate 1014. Additionally or alternatively, a wafer bonding process is utilized. However, any other appropriate coupling and/or bonding process can be implemented instead. In this example, a surface preservation process and/or surface treatment 1011 is applied.

FIG. 10F depicts the silicon substrate layer 1004 coupled to the dielectric substrate 1014 along with the conductive layer 1012. The example structure depicted in FIG. 10F is subsequent to the substrate 1008 being polished and the substrate 1006 being etched for at least partial removal thereof. In this example, the substrate 1008 and the substrate 1006 are substantially removed (e.g., entirely removed). Once the silicon substrate layer 1004 is exposed through the removal of the substrates 1008 and 1006, its top surface goes through the same preservation process as described above in connection with FIG. 10E.

Figure 11:
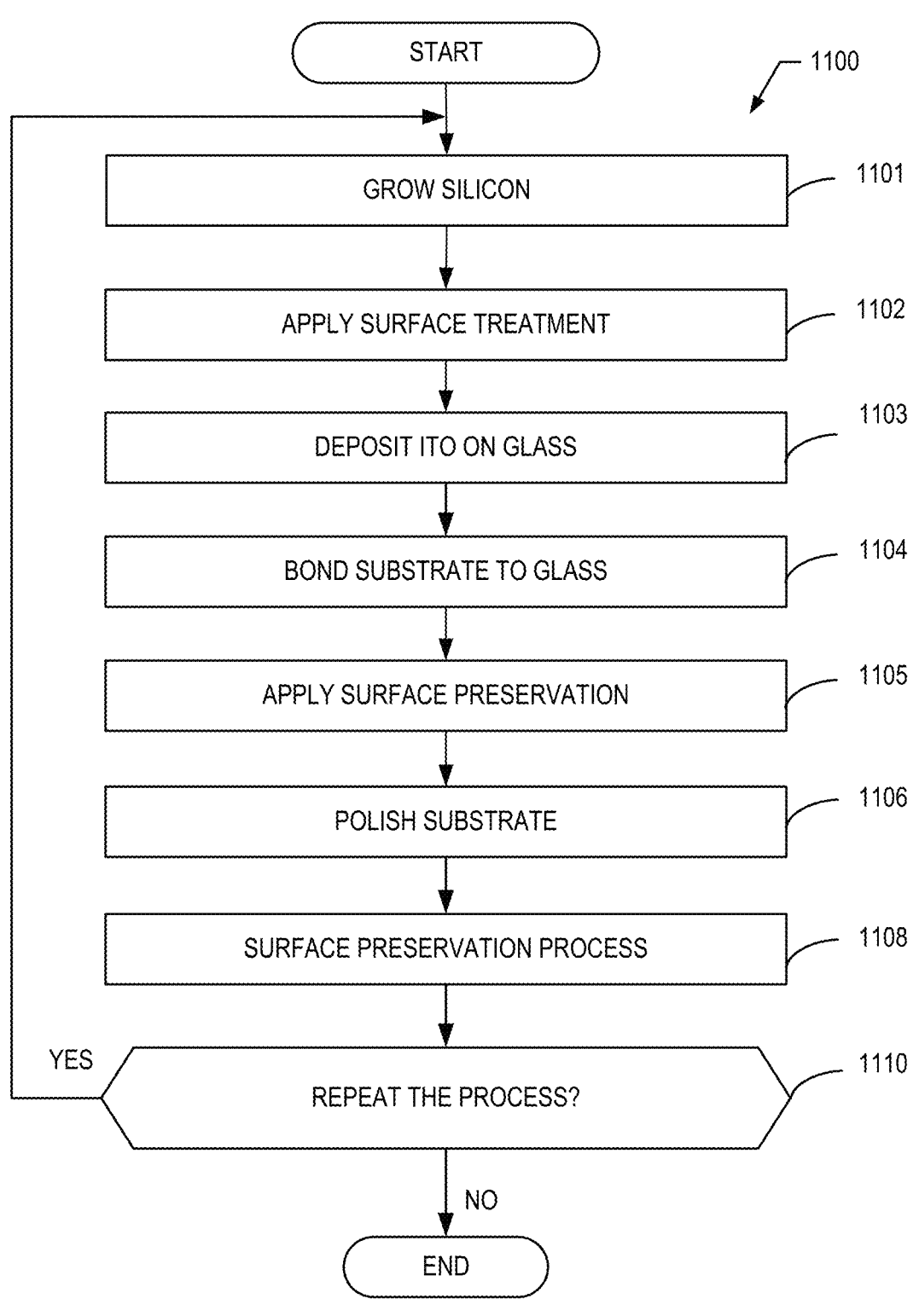
FIG. 11 is a flowchart representative of an example method to produce examples disclosed herein.

FIG. 11 is a flowchart representative of an example method 1100 to produce examples disclosed herein. The example method 1100 of FIG. 11 begins as a photonically steered antenna, such as the example photonically steered antenna 100 of FIG. 1, is to be produced and/or fabricated.

At block 1101, an example substrate with multiple silicon layers and a silicon dioxide layer undergoes a growth process to grow one of the silicon layers. For example, the thickness of the silicon layer can grow from approximately 5 μm to 17 μm. However, any other appropriate growth thickness(es) can be implemented, instead.

According to examples disclosed herein, at block 1102, one of the silicon layers of the substrate is applied with a surface preservation treatment. According to examples disclosed herein, a silicon epilayer surface preservation process is utilized.

At block 1103, in this example, ITO is deposited onto a dielectric substrate, such as the example dielectric substrate 106 shown in FIG. 1 or the dielectric substrate 1014 shown in FIGS. 10D-10F. In some other examples, the ITO is bonded and/or coupled (e.g., as an ITO layer). While ITO is implemented in this example, any appropriate other relatively transparent conductive layer material to define a ground plane can be implemented instead.

At block 1104, the example substrate having the silicon layers and the silicon dioxide layer is bonded to the dielectric substrate with the ITO. In this example, the semiconductor substrate is bonded to the dielectric substrate on a side of the glass substrate opposite to that of a side proximate and/or coupled to the ITO. In this example, a glass anodic process is utilized. However, any other appropriate bonding process can be implemented, instead.

At block 1105, one of the silicon layers of the example substrate is applied with a surface preservation treatment. According to examples disclosed herein, a silicon epilayer surface preservation process is utilized. However, any other appropriate process and/or methodology can, instead, be implemented.

At block 1106, in the illustrated example of FIG. 11, one of the silicon layers of the substrate is polished. In some examples, the aforementioned silicon layer is polished and entirely removed during a polishing process.

At block 1108, according to examples disclosed herein, a surface preservation process. In particular, an entire thickness of the silicon dioxide layer is removed and the surface preservation process is applied to the surface exposed by the silicon dioxide layer removal.

At block 1110, it is determined whether to repeat the process. If the process is to be repeated (block 1110), control of the process returns to block 1102. Otherwise, the process ends. The determination may be based on whether additional photonically steered antennas are to be produced.

Figure 12:
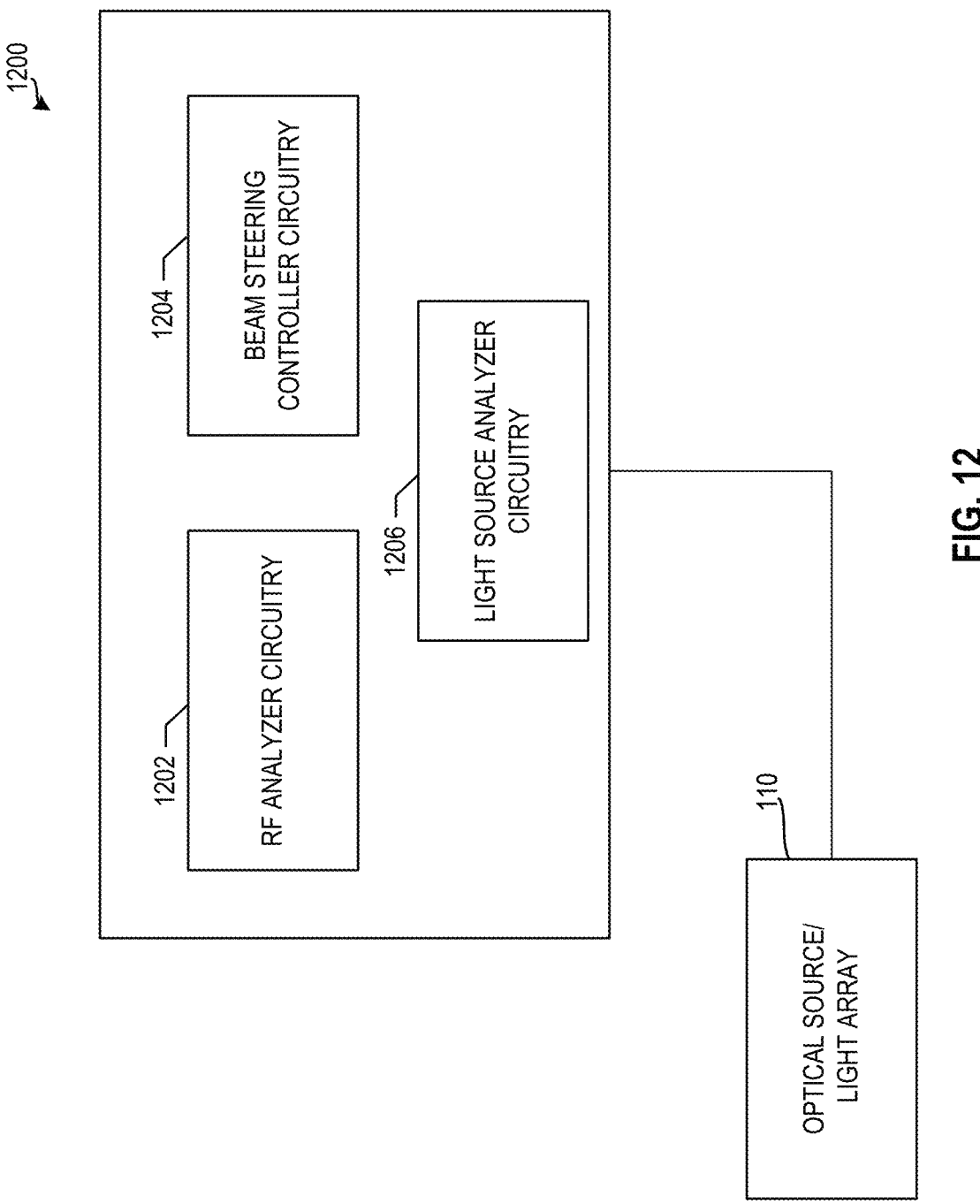
FIG. 12 is a block diagram of an example surface beam steering antenna control system that can be implemented with examples disclosed herein.

FIG. 12 is a block diagram of an example surface beam steering antenna control system (e.g., surface beam steering control circuitry) 1200 to direct surface beam steering according to examples disclosed herein. The example antenna control system 1200 may be implemented in the optical source 110 (e.g., a circuit board of the optical source 110). The surface beam steering antenna control system 1200 of FIG. 12 may be instantiated (e.g., creating an instance of, bring into being for any length of time, materialize, implement, etc.) by processor circuitry such as a central processing unit executing instructions. Additionally or alternatively, the surface beam steering antenna control system 1200 of FIG. 12 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 12 may, thus, be instantiated at the same or different times. Some or all of the circuitry may be instantiated, for example, in one or more threads executing concurrently on hardware and/or in series on hardware. Moreover, in some examples, some or all of the circuitry of FIG. 12 may be implemented by microprocessor circuitry executing instructions to implement one or more virtual machines and/or containers.

The surface beam steering antenna control system 1200 of the illustrated example includes example RF analyzer circuitry 1202, example beam steering controller circuitry 1204 and example light source analyzer circuitry 1206. In this example, the surface beam steering antenna control system 1200 is communicatively coupled to the example optical source 110 of FIG. 1.

The example RF analyzer circuitry 1202 determines beam steering parameters to be applied to RF signals (e.g., RF signals to be transmitted from a photonically beam steered antenna, such as the example antenna 100 shown in FIG. 1). For example, the RF analyzer circuitry 1202 can determine parameters such as phase, gain, amplitude, etc. for beam steering to be applied to an RF signal (e.g., an RF signal provided from the RFIC 124 shown in FIG. 1). Additionally or alternatively, the RF analyzer circuitry 1202 analyzes aspects and/or characteristics of the aforementioned RF signal for control of beam steering thereof. In some examples, the RF analyzer circuitry 1202 is instantiated by processor circuitry executing RF analyzer circuitry instructions and/or configured to perform operations such as those represented by the flowchart of FIG. 13.

The example beam steering controller circuitry 1204 is implemented to control the beam steering of the RF signal. According to examples disclosed herein, the beam steering controller circuitry 1204 directs the optical source 110 to provide and/or emit light to defined areas or portions of a photoinduced semiconductor substrate, such as the example semiconductor substrate 104 shown in FIG. 1. In particular, the beam steering controller circuitry 1204 may direct individual light sources (e.g., LEDs) of the optical source 110 to emit a light pattern (e.g., via an LED array) onto and/or toward the semiconductor substrate 104. In some examples, the beam steering controller circuitry 1204 determines and/or selects a light pattern to illuminate the semiconductor substrate 104 of FIG. 1 (e.g., based on beam steering parameters). Additionally or alternatively, the beam steering controller circuitry 1204 determines and/or selects individual portions of the semiconductor substrate 104 to be illuminated by the light source 110 based on beam steering settings (e.g., desired beam steering settings). In some examples, the beam steering controller circuitry is instantiated by processor circuitry executing beam steering controller circuitry instructions and/or configured to perform operations such as those represented by the flowchart of FIG. 13.

In the illustrated example, the light source analyzer circuitry 1206 controls a degree, intensity, coverage and/or perimeter shape of light illuminating the semiconductor substrate 104. In some examples, the light source analyzer circuitry 1206 controls an amount of surface of the semiconductor substrate 104 to be illuminated by the optical source 110. Additionally or alternatively, the example light source analyzer circuitry 1206 determines a duration for which the semiconductor substrate 104 is to be illuminated by the optical source 110.

While an example manner of implementing the surface beam steering antenna control system 1200 of FIG. 12 is illustrated in FIG. 12, one or more of the elements, processes, and/or devices illustrated in FIG. 12 may be combined, divided, re-arranged, omitted, eliminated, and/or implemented in any other way. Further, the example RF analyzer circuitry 1202, the example beam steering controller circuitry 1204, the example light source analyzer circuitry 1206, and/or, more generally, the example surface beam steering antenna control system 1200 of FIG. 12, may be implemented by hardware alone or by hardware in combination with software and/or firmware. Thus, for example, any of the example RF analyzer circuitry 1202, the example beam steering controller circuitry 1204, the example light source analyzer circuitry 1206, and/or, more generally, the example surface beam steering antenna control system 1200, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s)

(PLD(s)), and/or field programmable logic device(s) (FPLD(s)) such as Field Programmable Gate Arrays (FP-GAs). Further still, the example surface beam steering antenna control system 1200 of FIG. 12 may include one or more elements, processes, and/or devices in addition to, or instead of, those illustrated in FIG. 12, and/or may include more than one of any or all of the illustrated elements, processes and devices.

Figure 13:
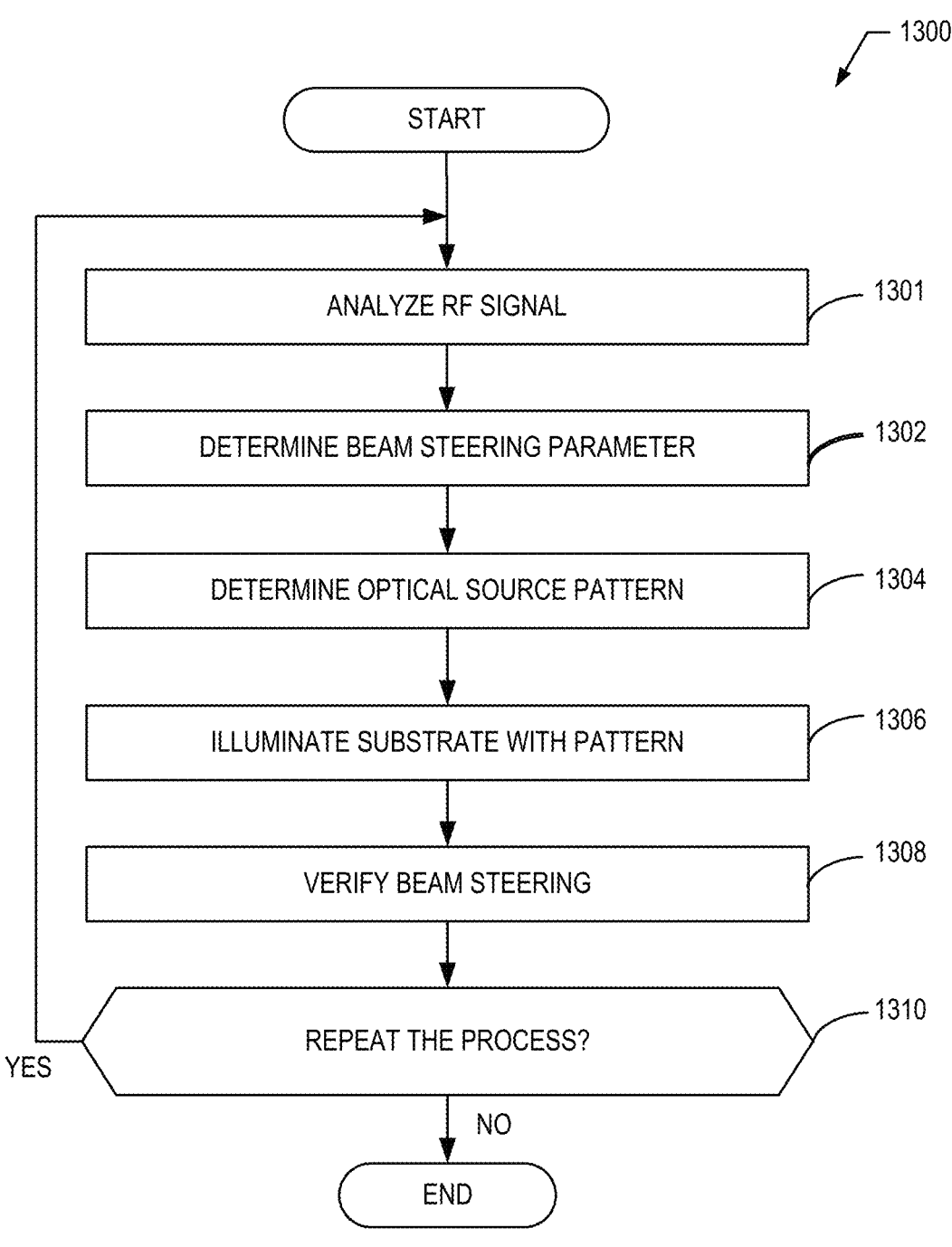
FIG. 13 is a flowchart representative of example machine readable instructions and/or example operations that may be executed by example processor circuitry to implement the example photonically steered antenna of FIG. 1 and/or the example surface beam steering antenna control system of FIG. 12.

A flowchart representative of example machine readable instructions, which may be executed to configure processor circuitry to implement the surface beam steering antenna control system 1200 of FIG. 12, is shown in FIG. 13. The machine readable instructions may be one or more executable programs or portion(s) of an executable program for execution by processor circuitry, such as the processor circuitry 1412 shown in the example processor platform 1400 discussed below in connection with FIG. 14 and/or the example processor circuitry discussed below in connection with FIGS. 15 and/or 16. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 13, many other methods of implementing the example surface beam steering antenna control system 1200 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example operations of FIG. 13 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer readable instructions, machine readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 13 is a flowchart representative of example machine readable instructions and/or example operations 1300 that may be executed and/or instantiated by processor circuitry to control beam steering via an illuminated impedance surface antenna, such as the example antenna 100 shown in connection with FIG. 1. The machine readable instructions and/or the operations 1300 of FIG. 13 begin at block 1301, at which the example RF analyzer circuitry 1202 analyzes and/or characterizes an RF signal (e.g., an RF signal provided from the RFIC 124 to be transmitted from the semiconductor substrate 104). Additionally or alternatively, the RF analyzer circuitry 1202 determines aspects of a signal being transmitted from the semiconductor substrate 104 (e.g., aspects of the signal without and/or negating the effects of illumination of the semiconductor substrate 104).

At block 1302, the example beam steering controller circuitry 1204 determines at least one parameter and/or setting of beam steering to be controlled via at least partial illumination of the semiconductor substrate 104 of the impedance surface antenna 100 to generate and/or define a solid-state plasma pattern. The at least one parameter can be based on the aforementioned analysis performed by the RF analyzer circuitry 1202 and can include, but is not limited to, impedance, phase, magnitude, etc. In some examples, the beam steering controller circuitry 1204 determines whether beam steering is to be performed.

At block 1304, the example light source analyzer circuitry 1206 and/or the example beam steering controller circuitry 1204 determines an optical source pattern to be illuminated onto the semiconductor substrate 104 of the impedance surface antenna 100. For example, a light pattern in the shape of a grid or other shape can be projected and/or illuminated by the optical source 110 onto the semiconductor substrate 104 having the solid-state plasma pattern. In particular, the example light source analyzer circuitry 1206 can determine a pattern (e.g., a two by two grid, a five by five grid, etc.) to project onto the semiconductor substrate 104 based on the aforementioned beam steering parameters and/or settings. In some such examples, the light source analyzer circuitry 1206 can determine individual light sources (e.g., individual LEDs such as the LEDs 212 of FIG. 2C) to be provided with sufficient voltage (e.g. a high voltage) to be illuminated. Additionally or alternatively, a grid-based or pixelated rendition of a shape, even a complex shape such as a cross or circle for example, can be determined for projection and/or illumination onto the semiconductor substrate 104.

At block 1306, the example light source analyzer circuitry 1206 causes the semiconductor substrate 104 to be illuminated by the example optical source 110. For example, the light source analyzer circuitry 1206 can cause at least one of an LED or laser array to illuminate and/or provide photonic energy to at least portions of the semiconductor substrate 104, which is provided with an RF signal from an RF source (e.g., from the RFIC 124).

At block 1308, in some examples, the beam steering controller circuitry 1204 and/or the RF analyzer circuitry 1202 verifies and/or determines that the beam steering performed by the beam steering antenna is within operating parameters. For example, the beam steering controller circuitry 1204 and/or the RF analyzer circuitry 1202 may determine a phase, amplitude and/or impedance of the beam steered signal transmitted via the semiconductor substrate 104 at least partially illuminated by the optical source 110.

At block 1310, it is determined whether to repeat the process. If the process is to be repeated (block 1310), control of the process returns to block 1302. Otherwise the process ends. The determination may be based on whether operation of the beam steering antenna is to continue or cease and/or the RF signal is no longer in need of transmission and/or beam steering.

Figure 14:
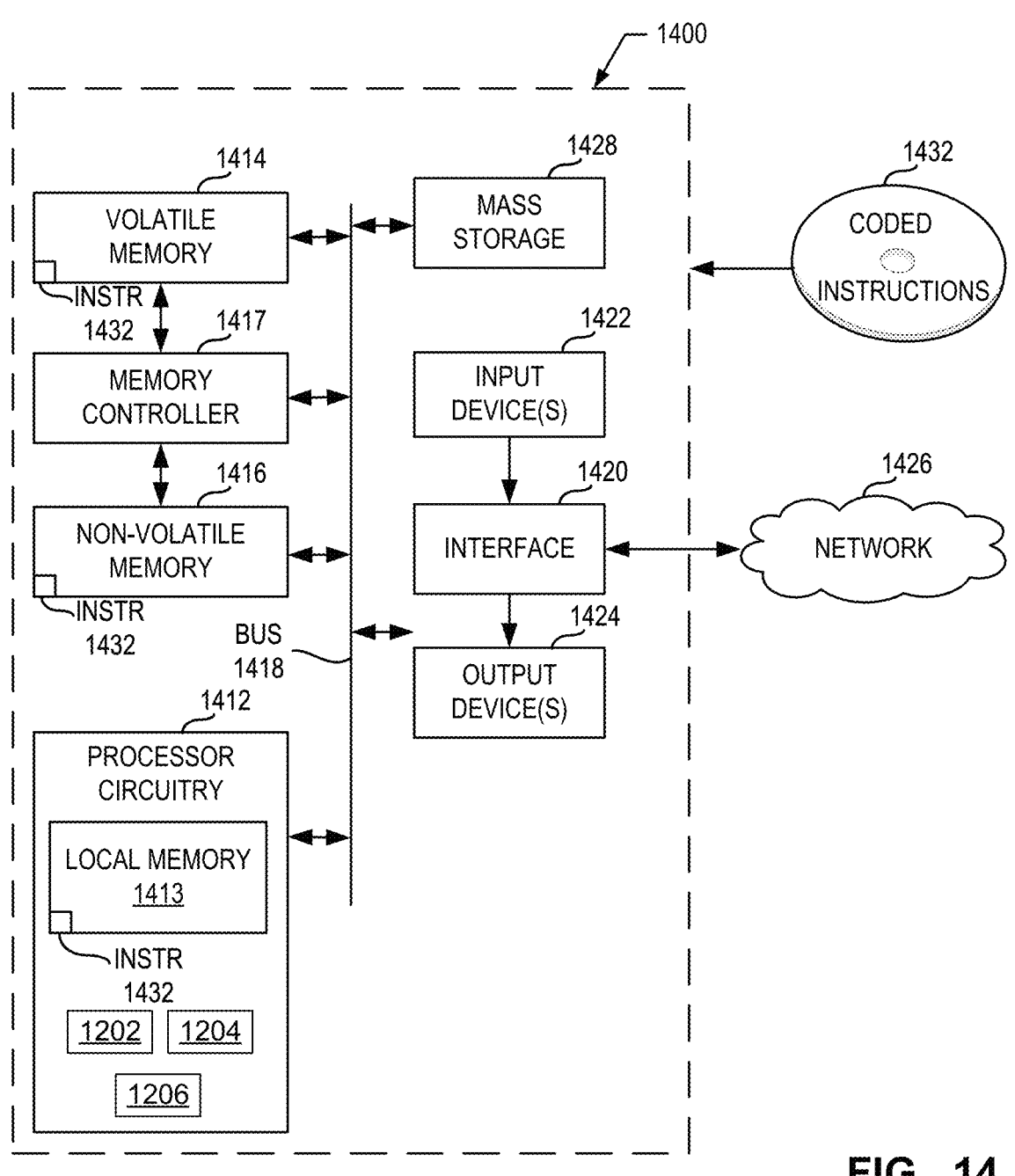
FIG. 14 is a block diagram of an example processing platform including processor circuitry structured to execute the example machine readable instructions and/or the example operations of FIG. 13 to implement the example surface beam steering antenna control system of FIG. 12.

FIG. 14 is a block diagram of an example processor platform 1400 structured to execute and/or instantiate the machine readable instructions and/or the operations of FIG. 13 to implement the surface beam steering antenna control system 1200 of FIG. 12. The processor platform 1400 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 1400 of the illustrated example includes processor circuitry 1412. The processor circuitry 1412 of the illustrated example is hardware. For example, the processor circuitry 1412 can be implemented by one or more integrated circuits, logic circuits, FPGAs, microprocessors, CPUs, GPUs, DSPs, and/or microcontrollers from any desired family or manufacturer. The processor circuitry 1412 may be implemented by one or more semiconductor based (e.g., silicon based) devices. In this example, the processor circuitry 1412 implements the example RF analyzer circuitry 1202, the example beam steering controller circuitry 1204, and the example light source analyzer circuitry 1206.

The processor circuitry 1412 of the illustrated example includes a local memory 1413 (e.g., a cache, registers, etc.). The processor circuitry 1412 of the illustrated example is in communication with a main memory including a volatile memory 1414 and a non-volatile memory 1416 by a bus 1418. The volatile memory 1414 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1416 may be implemented by flash memory and/or any other desired type of memory device. Access to the main memory 1414, 1416 of the illustrated example is controlled by a memory controller 1417.

The processor platform 1400 of the illustrated example also includes interface circuitry 1420. The interface circuitry 1420 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1422 are connected to the interface circuitry 1420. The input device(s) 1422 permit(s) a user to enter data and/or commands into the processor circuitry 1412. The input device(s) 1422 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1424 are also connected to the interface circuitry 1420 of the illustrated example. The output device(s) 1424 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1420 of the illustrated example, thus, typically includes a graphics driver card, a graphics driver chip, and/or graphics processor circuitry such as a GPU.

The interface circuitry 1420 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1426. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1400 of the illustrated example also includes one or more mass storage devices 1428 to store software and/or data. Examples of such mass storage devices 1428 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 1432, which may be implemented by the machine readable instructions of FIG. 13, may be stored in the mass storage device 1428, in the volatile memory 1414, in the non-volatile memory 1416, and/or on a removable non-transitory computer readable storage medium such as a CD or DVD.

Figure 15:
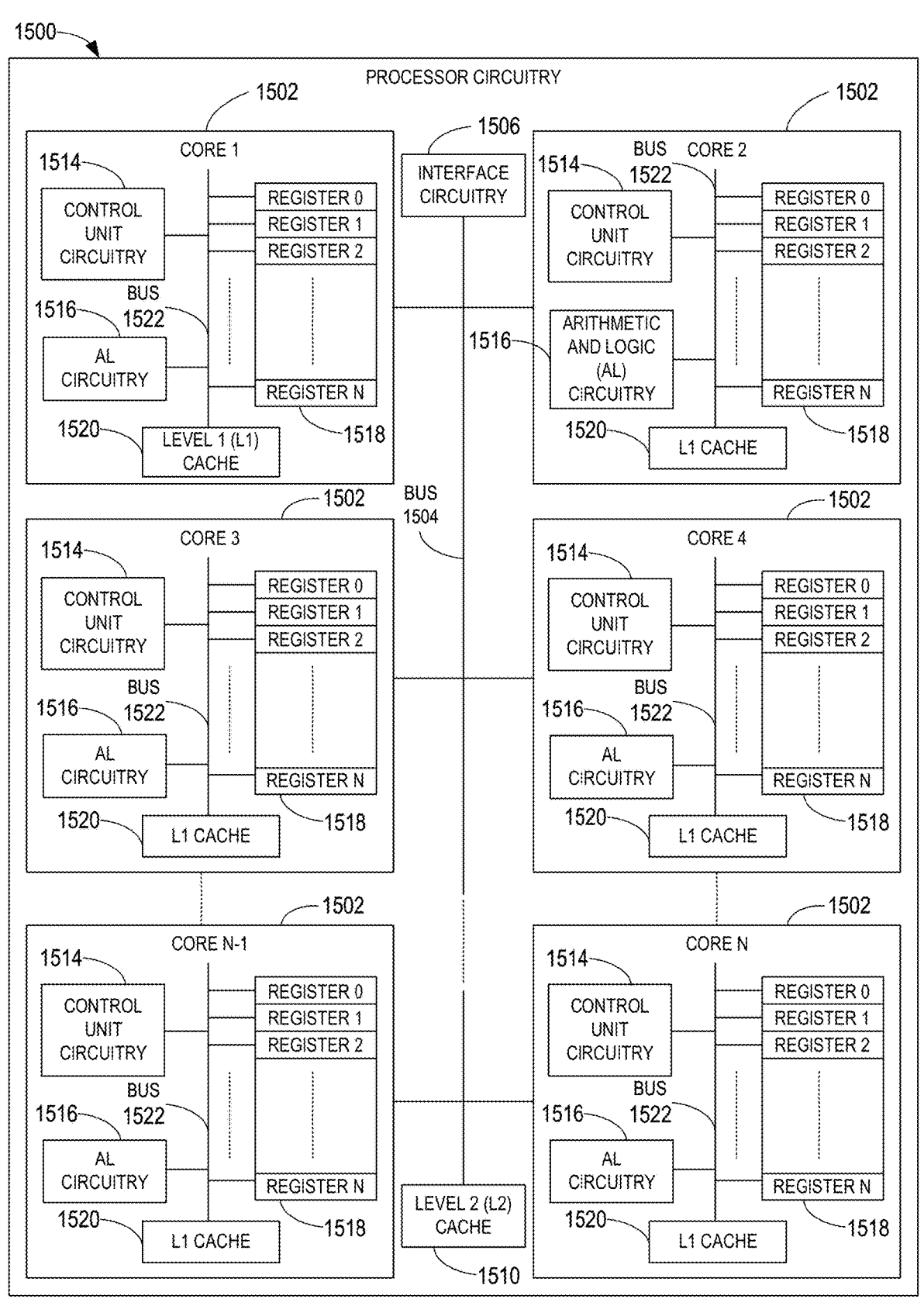
FIG. 15 is a block diagram of an example implementation of the processor circuitry of FIG. 14.

FIG. 15 is a block diagram of an example implementation of the processor circuitry 1412 of FIG. 14. In this example, the processor circuitry 1412 of FIG. 14 is implemented by a microprocessor 1500. For example, the microprocessor 1500 may be a general purpose microprocessor (e.g., general purpose microprocessor circuitry). The microprocessor 1500 executes some or all of the machine readable instructions of the flowchart of FIG. 13 to effectively instantiate the circuitry of FIG. 12 as logic circuits to perform the operations corresponding to those machine readable instructions. In some such examples, the circuitry of FIG. 12 is instantiated by the hardware circuits of the microprocessor 1500 in combination with the instructions. For example, the microprocessor 1500 may be implemented by multi-core hardware circuitry such as a CPU, a DSP, a GPU, an XPU, etc. Although it may include any number of example cores 1502 (e.g., 1 core), the microprocessor 1500 of this example is a multi-core semiconductor device including N cores. The cores 1502 of the microprocessor 1500 may operate independently or may cooperate to execute machine readable instructions. For example, machine code corresponding to a firmware program, an embedded software program, or a software program may be executed by one of the cores 1502 or may be executed by multiple ones of the cores 1502 at the same or different times. In some examples, the machine code corresponding to the firmware program, the embedded software program, or the software program is split into threads and executed in parallel by two or more of the cores 1502. The software program may correspond to a portion or all of the machine readable instructions and/or operations represented by the flowchart of FIG. 13.

The cores 1502 may communicate by a first example bus 1504. In some examples, the first bus 1504 may be implemented by a communication bus to effectuate communication associated with one(s) of the cores 1502. For example, the first bus 1504 may be implemented by at least one of an Inter-Integrated Circuit (I2C) bus, a Serial Peripheral Interface (SPI) bus, a PCI bus, or a PCIe bus. Additionally or alternatively, the first bus 1504 may be implemented by any other type of computing or electrical bus. The cores 1502 may obtain data, instructions, and/or signals from one or more external devices by example interface circuitry 1506. The cores 1502 may output data, instructions, and/or signals to the one or more external devices by the interface circuitry 1506. Although the cores 1502 of this example include example local memory 1520 (e.g., Level 1 (L1) cache that may be split into an L1 data cache and an L1 instruction cache), the microprocessor 1500 also includes example shared memory 1510 that may be shared by the cores (e.g., Level 2 (L2 cache)) for high-speed access to data and/or instructions. Data and/or instructions may be transferred (e.g., shared) by writing to and/or reading from the shared memory 1510. The local memory 1520 of each of the cores 1502 and the shared memory 1510 may be part of a hierarchy of storage devices including multiple levels of cache memory and the main memory (e.g., the main memory 1414, 1416 of FIG. 14). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1502 may be referred to as a CPU, DSP, GPU, etc., or any other type of hardware circuitry. Each core 1502 includes control unit circuitry 1514, arithmetic and logic (AL) circuitry (sometimes referred to as an ALU) 1516, a plurality of registers 1518, the local memory 1520, and a second example bus 1522. Other structures may be present. For example, each core 1502 may include vector unit circuitry, single instruction multiple data (SIMD) unit circuitry, load/store unit (LSU) circuitry, branch/jump unit circuitry, floating-point unit (FPU) circuitry, etc. The control unit circuitry 1514 includes semiconductor-based circuits structured to control (e.g., coordinate) data movement within the corresponding core 1502. The AL circuitry 1516 includes semiconductor-based circuits structured to perform one or more mathematic and/or logic operations on the data within the corresponding core 1502. The AL circuitry 1516 of some examples performs integer based operations. In other examples, the AL circuitry 1516 also performs floating point operations. In yet other examples, the AL circuitry 1516 may include first AL circuitry that performs integer based operations and second AL circuitry that performs floating point operations. In some examples, the AL circuitry 1516 may be referred to as an Arithmetic Logic Unit (ALU). The registers 1518 are semiconductor-based structures to store data and/or instructions such as results of one or more of the operations performed by the AL circuitry 1516 of the corresponding core 1502. For example, the registers 1518 may include vector register(s), SIMD register(s), general purpose register(s), flag register(s), segment register(s), machine specific register(s), instruction pointer register(s), control register(s), debug register(s), memory management register(s), machine check register(s), etc. The registers 1518 may be arranged in a bank as shown in FIG. 15. Alternatively, the registers 1518 may be organized in any other arrangement, format, or structure including distributed throughout the core 1502 to shorten access time. The second bus 1522 may be implemented by at least one of an I2C bus, a SPI bus, a PCI bus, or a PCIe bus Each core 1502 and/or, more generally, the microprocessor 1500 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1500 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 16:
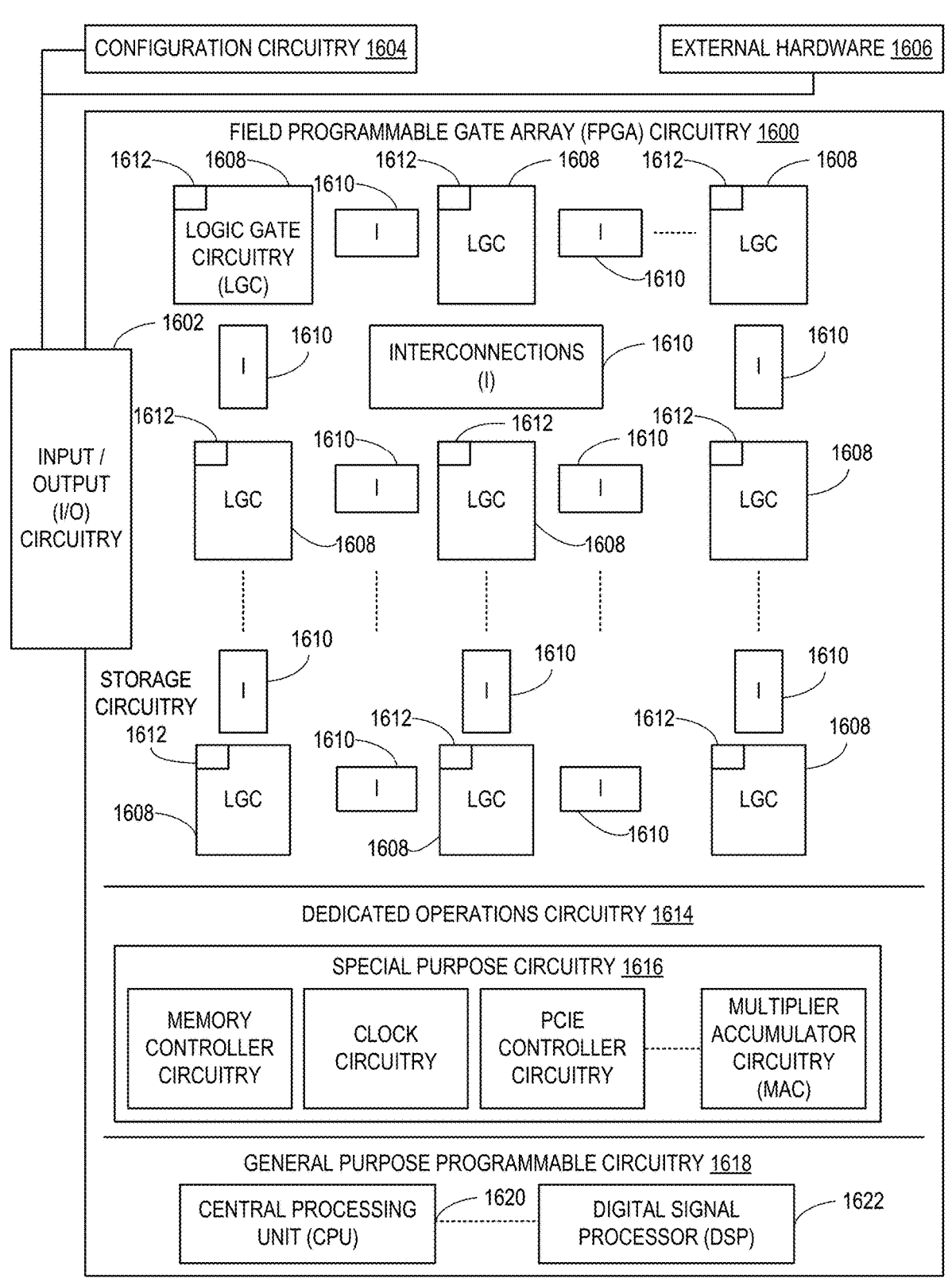
FIG. 16 is a block diagram of another example implementation of the processor circuitry of FIG. 14.
Figure 17:
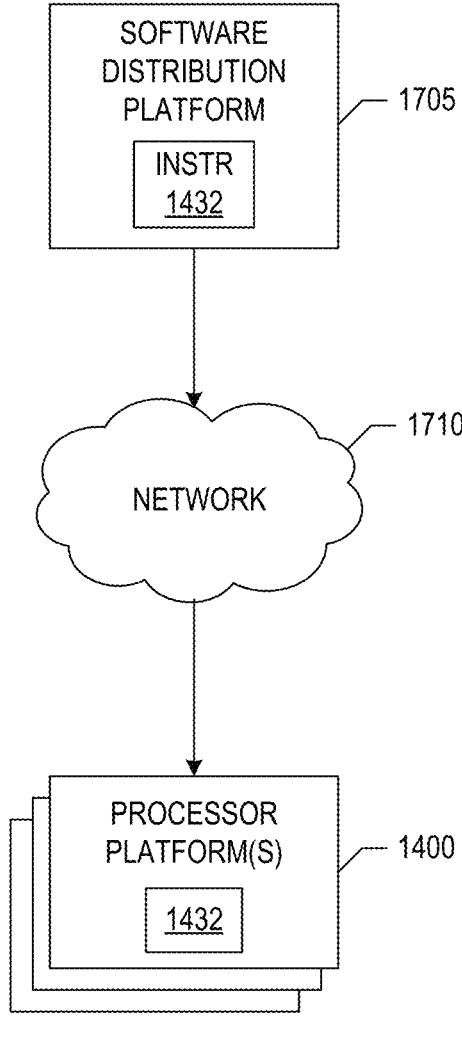
FIG. 17 is a block diagram of an example software distribution platform (e.g., one or more servers) to distribute software (e.g., software corresponding to the example machine readable instructions of FIG. 13) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

FIG. 16 is a block diagram of another example implementation of the processor circuitry 1412 of FIG. 14. In this example, the processor circuitry 1412 is implemented by FPGA circuitry 1600. For example, the FPGA circuitry 1600 may be implemented by an FPGA. The FPGA circuitry 1600 can be used, for example, to perform operations that could otherwise be performed by the example microprocessor 1500 of FIG. 15 executing corresponding machine readable instructions. However, once configured, the FPGA circuitry 1600 instantiates the machine readable instructions in hardware and, thus, can often execute the operations faster than they could be performed by a general purpose microprocessor executing the corresponding software.

More specifically, in contrast to the microprocessor 1500 of FIG. 15 described above (which is a general purpose device that may be programmed to execute some or all of the machine readable instructions represented by the flowchart of FIG. 13 but whose interconnections and logic circuitry are fixed once fabricated), the FPGA circuitry 1600 of the example of FIG. 16 includes interconnections and logic circuitry that may be configured and/or interconnected in different ways after fabrication to instantiate, for example, some or all of the machine readable instructions represented by the flowchart of FIG. 13. In particular, the FPGA circuitry 1600 may be thought of as an array of logic gates, interconnections, and switches. The switches can be programmed to change how the logic gates are interconnected by the interconnections, effectively forming one or more dedicated logic circuits (unless and until the FPGA circuitry 1600 is reprogrammed). The configured logic circuits enable the logic gates to cooperate in different ways to perform different operations on data received by input circuitry. Those operations may correspond to some or all of the software represented by the flowchart of FIG. 13. As such, the FPGA circuitry 1600 may be structured to effectively instantiate some or all of the machine readable instructions of the flowchart of FIG. 13 as dedicated logic circuits to perform the operations corresponding to those software instructions in a dedicated manner analogous to an ASIC. Therefore, the FPGA circuitry 1600 may perform the operations corresponding to the some or all of the machine readable instructions of FIG. 13 faster than the general purpose microprocessor can execute the same.

In the example of FIG. 6, the FPGA circuitry 1600 is structured to be programmed (and/or reprogrammed one or more times) by an end user by a hardware description language (HDL) such as Verilog. The FPGA circuitry 1600 of FIG. 6, includes example input/output (I/O) circuitry 1602 to obtain and/or output data to/from example configuration circuitry 1604 and/or external hardware 1606. For example, the configuration circuitry 1604 may be implemented by interface circuitry that may obtain machine readable instructions to configure the FPGA circuitry 1600, or portion(s) thereof. In some such examples, the configuration circuitry 1604 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1606 may be implemented by external hardware circuitry. For example, the external hardware 1606 may be implemented by the microprocessor 1500 of FIG. 15. The FPGA circuitry 1600 also includes an array of example logic gate circuitry 1608, a plurality of example configurable interconnections 1610, and example storage circuitry 1612. The logic gate circuitry 1608 and the configurable interconnections 1610 are configurable to instantiate one or more operations that may correspond to at least some of the machine readable instructions of FIG. 13 and/or other desired operations. The logic gate circuitry 1608 shown in FIG. 16 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1608 to enable configuration of the electrical structures and/or the logic gates to form circuits to perform desired operations. The logic gate circuitry 1608 may include other electrical structures such as look-up tables (LUTs), registers (e.g., flip-flops or latches), multiplexers, etc.

The configurable interconnections 1610 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1608 to program desired logic circuits.

The storage circuitry 1612 of the illustrated example is structured to store result(s) of the one or more of the operations performed by corresponding logic gates. The storage circuitry 1612 may be implemented by registers or the like. In the illustrated example, the storage circuitry 1612 is distributed amongst the logic gate circuitry 1608 to facilitate access and increase execution speed.

The example FPGA circuitry 1600 of FIG. 16 also includes example Dedicated Operations Circuitry 1614. In this example, the Dedicated Operations Circuitry 1614 includes special purpose circuitry 1616 that may be invoked to implement commonly used functions to avoid the need to program those functions in the field. Examples of such special purpose circuitry 1616 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1600 may also include example general purpose programmable circuitry 1618 such as an example CPU 1620 and/or an example DSP 1622. Other general purpose programmable circuitry 1618 may additionally or alternatively be present such as a GPU, an XPU, etc., that can be programmed to perform other operations.

Although FIGS. 15 and 16 illustrate two example implementations of the processor circuitry 1412 of FIG. 14, many other approaches are contemplated. For example, as mentioned above, modern FPGA circuitry may include an on-board CPU, such as one or more of the example CPU 1620 of FIG. 16. Therefore, the processor circuitry 1412 of FIG. 14 may additionally be implemented by combining the example microprocessor 1500 of FIG. 15 and the example FPGA circuitry 1600 of FIG. 16. In some such hybrid examples, a first portion of the machine readable instructions represented by the flowchart of FIG. 13 may be executed by one or more of the cores 1502 of FIG. 15, a second portion of the machine readable instructions represented by the flowchart of FIG. 13 may be executed by the FPGA circuitry 1600 of FIG. 16, and/or a third portion of the machine readable instructions represented by the flowchart of FIG. 13 may be executed by an ASIC. It should be understood that some or all of the circuitry of FIG. 12 may, thus, be instantiated at the same or different times. Some or all of the circuitry may be instantiated, for example, in one or more threads executing concurrently and/or in series. Moreover, in some examples, some or all of the circuitry of FIG. 12 may be implemented within one or more virtual machines and/or containers executing on the microprocessor.

In some examples, the processor circuitry 1412 of FIG. 14 may be in one or more packages. For example, the microprocessor 1500 of FIG. 15 and/or the FPGA circuitry 1600 of FIG. 6 may be in one or more packages. In some examples, an XPU may be implemented by the processor circuitry 1412 of FIG. 4, which may be in one or more packages. For example, the XPU may include a CPU in one package, a DSP in another package, a GPU in yet another package, and an FPGA in still yet another package.

A block diagram illustrating an example software distribution platform 1705 to distribute software such as the example machine readable instructions 1432 of FIG. 14 to hardware devices owned and/or operated by third parties is illustrated. The example software distribution platform 1705 may be implemented by any computer server, data facility, cloud service, etc., capable of storing and transmitting software to other computing devices. The third parties may be customers of the entity owning and/or operating the software distribution platform 1705. For example, the entity that owns and/or operates the software distribution platform 1705 may be a developer, a seller, and/or a licensor of software such as the example machine readable instructions 1432 of FIG. 14. The third parties may be consumers, users, retailers, OEMs, etc., who purchase and/or license the software for use and/or re-sale and/or sub-licensing. In the illustrated example, the software distribution platform 1705 includes one or more servers and one or more storage devices. The storage devices store the machine readable instructions 1432, which may correspond to the example machine readable instructions 1300 of FIG. 1300, as described above. The one or more servers of the example software distribution platform 1705 are in communication with an example network 1710. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 1432 from the software distribution platform 1705. For example, the software, which may correspond to the example machine readable instructions 1300 of FIG. 13, may be downloaded to the example processor platform 1400, which is to execute the machine readable instructions 1432 to implement the beam steering antenna control system 1200. In some examples, one or more servers of the software distribution platform 1705 periodically offer, transmit, and/or force updates to the software (e.g., the example machine readable instructions 1432 of FIG. 14) to ensure improvements, patches, updates, etc., are distributed and applied to the software at the end user devices.

The example photonically steered antenna 100 disclosed herein may be included in any suitable electronic compo- nent. FIGS. 18-22 illustrate various examples of apparatus that may include any of the photonically steered antennas 100 disclosed herein.

Figure 18:
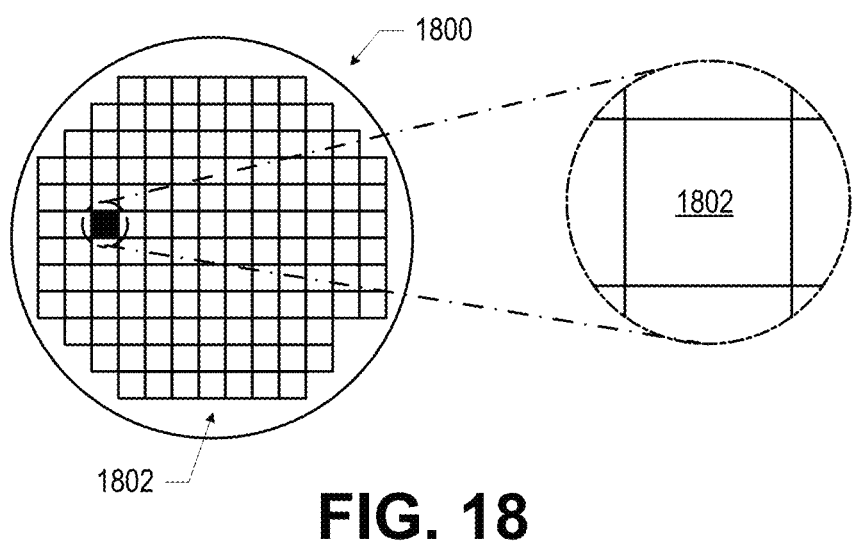
FIG. 18 is a top view of a wafer and dies that may include a photonic beam steering surface antenna, in accordance with any of the examples disclosed herein.

FIG. 18 is a top view of a wafer 1800 and dies 1802 that may include one or more photonically steered antennas 100, or may be included in an IC package whose substrate includes one or more photonically steered antennas 100 (e.g., as discussed below with reference to FIG. 20) in accordance with any of the examples disclosed herein. The wafer 1800 may be composed of semiconductor material and may include one or more dies 1802 having IC structures formed on a surface of the wafer 1800. Each of the dies 1802 may be a repeating unit of a semiconductor product that includes any suitable IC. After the fabrication of the semi- conductor product is complete, the wafer 1800 may undergo a singulation process in which the dies 1802 are separated from one another to provide discrete "chips" of the semi- conductor product. The die 2202 may include one or more photonically steered antennas 100 (e.g., as discussed below with reference to FIG. 19), one or more transistors (e.g., some of the transistors 1940 of FIG. 19, discussed below) and/or supporting circuitry to route electrical signals to the transistors, as well as any other IC components. In some examples, the wafer 1800 or the die 1802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1802. For example, a memory array formed by multiple memory devices may be formed on a same die 1802 as a processing device (e.g., the processing device 1802 of FIG. 18) or other logic that is configured to store information in the memory devices or execute instructions stored in the memory array.

Figure 19:
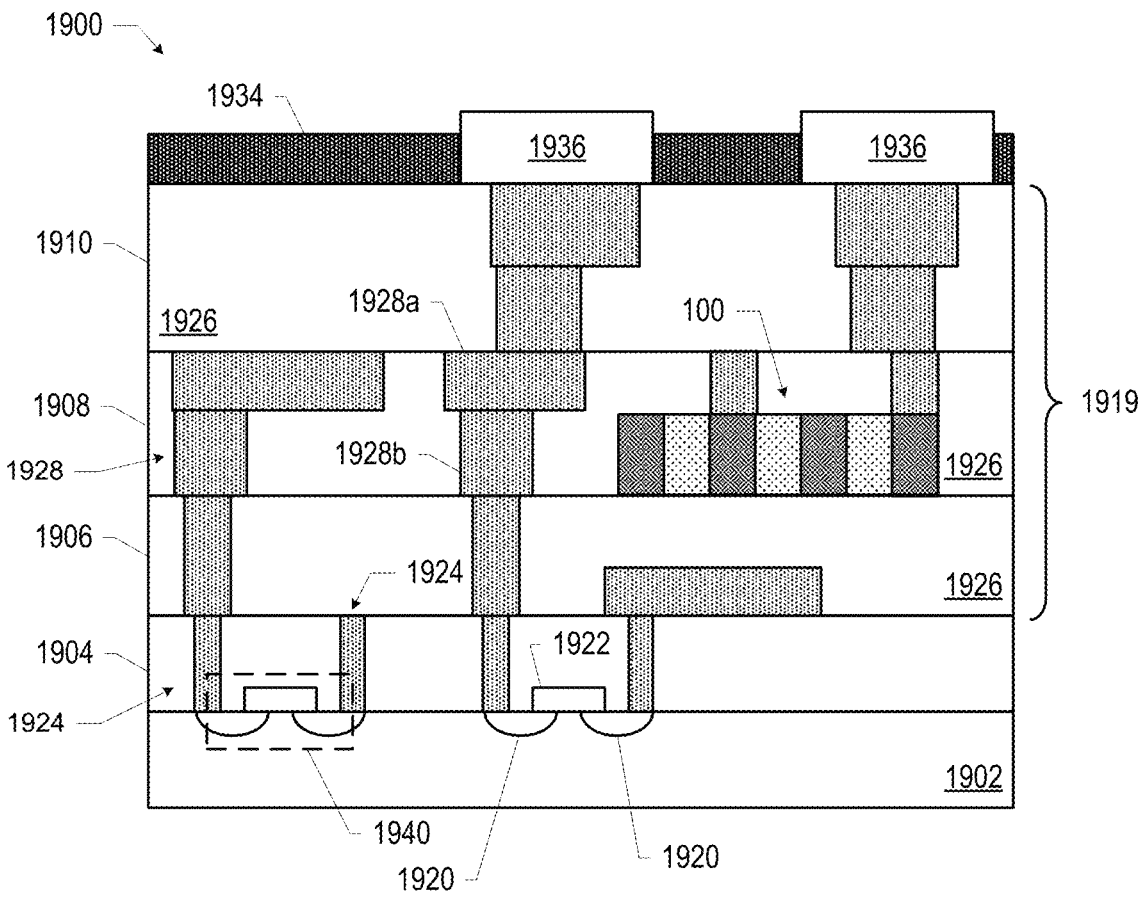
FIG. 19 is a cross-sectional side view of an integrated circuit (IC) device that may include a photonic beam steering surface antenna, in accordance with any of the examples disclosed herein.

FIG. 19 is a cross-sectional side view of an IC device 1900 that may include one or more photonically steered antennas 100, or may be included in an IC package whose substrate includes one or more photonically steered antennas 100 (e.g., as discussed below with reference to FIG. 20), in accordance with any of the examples disclosed herein. One or more of the IC devices 1900 may be included in one or more dies 1802 (FIG. 18). The IC device 1900 may be formed on a substrate 1902 (e.g., the wafer 1800 of FIG. 18) and may be included in a die (e.g., the die 1802 of FIG. 18). The substrate 1902 may be a semiconductor substrate com- posed of semiconductor material systems including, for example, n-type or p-type materials systems (or a combina- tion of both). The substrate 1902 may include, for example, a crystalline substrate formed using a bulk silicon or a silicon-on-insulator (SOI) substructure. In some examples, the substrate 1902 may be formed using alternative materi- als, which may or may not be combined with silicon, that include but are not limited to germanium, indium anti- monide, lead telluride, indium arsenide, indium phosphide, gallium arsenide, or gallium antimonide. Further materials classified as group II-VI, III-V, or IV may also be used to form the substrate 1902. Although a few examples of materials from which the substrate 1902 may be formed are described here, any material that may serve as a foundation for an IC device 1900 may be used. The substrate 1902 may be part of a singulated die (e.g., the dies 1802 of FIG. 18) or a wafer (e.g., the wafer 1800 of FIG. 18).

The IC device 1900 may include one or more device layers 1904 disposed on the substrate 1902. The device layer 1904 may include features of one or more transistors 1940 (e.g., metal oxide semiconductor field-effect transistors (MOSFETs)) formed on the substrate 1902. The device layer 1904 may include, for example, one or more source and/or drain (S/D) regions 1920, a gate 1922 to control current flow in the transistors 1940 between the S/D regions 1920, and one or more S/D contacts 1924 to route electrical signals to/from the S/D regions 1920. The transistors 1940 may include additional features not depicted for the sake of clarity, such as device isolation regions, gate contacts, and the like. The transistors 1940 are not limited to the type and configuration depicted in FIG. 19 and may include a wide variety of other types and configurations such as, for example, planar transistors, non-planar transistors, or a combination of both. Non-planar transistors may include FinFET transistors, such as double-gate transistors or tri- gate transistors, and wrap-around or all-around gate transis- tors, such as nanoribbon and nanowire transistors.

Each transistor 1940 may include a gate 1922 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirco- nium silicon oxide, tantalum oxide, titanium oxide, barium strontium titanium oxide, barium titanium oxide, strontium titanium oxide, yttrium oxide, aluminum oxide, lead scan- dium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 1940 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palla- dium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 1940 along the source-channel-drain direction, the gate electrode may consist of a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 1920 may be formed within the substrate 1902 adjacent to the gate 1922 of each transistor 1940. The S/D regions 1920 may be formed using an implantation/diffusion process or an etching/deposition process, for example. In the former process, dopants such as boron, aluminum, antimony, phosphorous, or arsenic may be ion-implanted into the substrate 1902 to form the S/D regions 1920. An annealing process that activates the dopants and causes them to diffuse farther into the substrate 1902 may follow the ion-implantation process. In the latter process, the substrate 1902 may first be etched to form recesses at the locations of the S/D regions 1920. An epitaxial deposition process may then be carried out to fill the recesses with material that is used to fabricate the S/D regions 1920. In some implementations, the S/D regions 1920 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 1920 may be formed using one or more alternate semiconductor materials such as germanium or a group III-V material or alloy. In further examples, one or more layers of metal and/or metal alloys may be used to form the S/D regions 1920.

In some examples, the device layer 1904 may include one or more photonically steered antennas 100, in addition to or instead of transistors 1940. FIG. 19 illustrates a single photonically steered antenna 100 in the device layer 1904 for illustration purposes, but any number and structure of photonically steered antennas 100 may be included in a device layer 1904. A photonically steered antenna 100 included in a device layer 1904 may be referred to as a "front end" device. In some examples, the IC device 1900 may not include any front end photonically steered antenna 100. One or more photonically steered antennas 100 in the device layer 1904 may be coupled to any suitable other ones of the devices in the device layer 1904, to any devices in the metallization stack 1919 (discussed below), and/or to one or more of the conductive contacts 1936 (discussed below).

Electrical signals, such as power and/or input/output (I/O) signals, may be routed to and/or from the devices (e.g., transistors 1940 and/or photonically steered antennas 100) of the device layer 1904 through one or more interconnect layers disposed on the device layer 1904 (illustrated in FIG. 19 as interconnect layers 1906-1910). For example, electrically conductive features of the device layer 1904 (e.g., the gate 1922 and the S/D contacts 1924) may be electrically coupled with the interconnect structures 1928 of the interconnect layers 1906-1910. The one or more interconnect layers 1906-1910 may form a metallization stack (also referred to as an "ILD stack") 1919 of the IC device 1900. In some examples, one or more photonically steered antennas 100 may be disposed in one or more of the interconnect layers 1906-1910, in accordance with any of the techniques disclosed herein. FIG. 19 illustrates a single photonically steered antenna 100 in the interconnect layer 1908 for illustration purposes, but any number and structure of photonically steered antennas 100 may be included in any one or more of the layers in a metallization stack 1919. A photonically steered antenna 100 included in the metallization stack 1919 may be referred to as a "back-end" device. In some examples, the IC device 1900 may not include any back-end photonically steered antennas 100; in some examples, the IC device 1900 may include both front- and back-end photonically steered antennas 100. One or more photonically steered antennas 100 in the metallization stack 1919 may be coupled to any suitable ones of the devices in the device layer 1904, and/or to one or more of the conductive contacts 1936 (discussed below).

The interconnect structures 1928 may be arranged within the interconnect layers 1906-1910 to route electrical signals according to a wide variety of designs (in particular, the arrangement is not limited to the particular configuration of interconnect structures 1928 depicted in FIG. 19). Although a particular number of interconnect layers 1906-1910 is depicted in FIG. 19, examples of the present disclosure include IC devices having more or fewer interconnect layers than depicted.

In some examples, the interconnect structures 1928 may include lines 1928*a* and/or vias 1928*b* filled with an electrically conductive material such as a metal. The lines 1928*a* may be arranged to route electrical signals in a direction of a plane that is substantially parallel with a surface of the substrate 1902 upon which the device layer 1904 is formed. For example, the lines 1928*a* may route electrical signals in a direction in and out of the page from the perspective of FIG. 19. The vias 1928*b* may be arranged to route electrical signals in a direction of a plane that is substantially perpendicular to the surface of the substrate 1902 upon which the device layer 1904 is formed. In some examples, the vias 1928*b* may electrically couple lines 1928*a* of different interconnect layers 1906-1910 together.

The interconnect layers 1906-1910 may include a dielectric material 1926 disposed between the interconnect structures 1928, as shown in FIG. 19. In some examples, the dielectric material 1926 disposed between the interconnect structures 1928 in different ones of the interconnect layers 1906-1910 may have different compositions; in other examples, the composition of the dielectric material 1926 between different interconnect layers 1906-1910 may be the same.

A first interconnect layer 1906 (referred to as Metal 1 or "M1") may be formed directly on the device layer 1904. In some examples, the first interconnect layer 1906 may include lines 1928a and/or vias 1928b, as shown. The lines 1928a of the first interconnect layer 1906 may be coupled with contacts (e.g., the S/D contacts 1924) of the device layer 1904.

A second interconnect layer 1908 (referred to as Metal 2 or "M2") may be formed directly on the first interconnect layer 1906. In some examples, the second interconnect layer 1908 may include vias 1928b to couple the lines 1928a of the second interconnect layer 1908 with the lines 1928a of the first interconnect layer 1906. Although the lines 1928a and the vias 1928b are structurally delineated with a line within each interconnect layer (e.g., within the second interconnect layer 1908) for the sake of clarity, the lines 1928a and the vias 1928b may be structurally and/or materially contiguous (e.g., simultaneously filled during a dual-damascene process) in some examples.

A third interconnect layer 1910 (referred to as Metal 3 or "M3") (and additional interconnect layers, as desired) may be formed in succession on the second interconnect layer 1908 according to similar techniques and configurations described in connection with the second interconnect layer 1908 or the first interconnect layer 1906. In some examples, the interconnect layers that are "higher up" in the metallization stack 1919 in the IC device 1900 (i.e., further away from the device layer 1904) may be thicker.

The IC device 1900 may include a solder resist material 1934 (e.g., polyimide or similar material) and one or more conductive contacts 1936 formed on the interconnect layers 1906-1910. In FIG. 19, the conductive contacts 1936 are illustrated as taking the form of bond pads. The conductive contacts 1936 may be electrically coupled with the interconnect structures 1928 and configured to route the electrical signals of the transistor(s) 1940 to other external devices. For example, solder bonds may be formed on the one or more conductive contacts 1936 to mechanically and/or electrically couple a chip including the IC device 1900 with another component (e.g., a circuit board). The IC device 1900 may include additional or alternate structures to route the electrical signals from the interconnect layers 1906-1910; for example, the conductive contacts 1936 may include other analogous features (e.g., posts) that route the electrical signals to external components.

Figure 20:
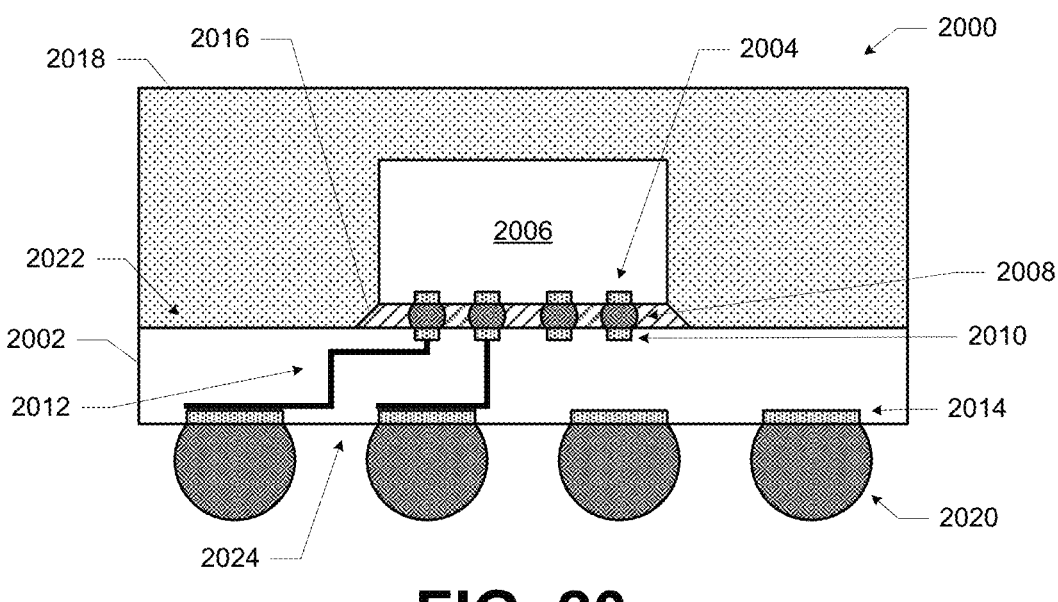
FIG. 20 is a cross-sectional side view of an IC package that may include a photonic beam steering surface antenna, in accordance with various examples.

FIG. 20 is a cross-sectional view of an example IC package 2000 that may include one or more photonically steered antennas 100. The package substrate 2002 may be formed of a dielectric material, and may have conductive pathways extending through the dielectric material between upper and lower faces 2022, 2024, or between different locations on the upper face 2022, and/or between different locations on the lower face 2024. These conductive pathways may take the form of any of the interconnects 1928 discussed above with reference to FIG. 19. FIG. 20 illustrates a single photonically steered antenna 100 in the package substrate 2002, but this number and location of photonically steered antennas 100 in the IC package 2000 is simply illustrative, and any number of photonically steered antennas 100 (with any suitable structure) may be included in a package substrate 2002. In some examples, no photonically steered antenna 100 may be included in the package substrate 2002.

The IC package 2000 may include a die 2006 coupled to the package substrate 2002 via conductive contacts 2004 of the die 2006, first-level interconnects 2008, and conductive contacts 2010 of the package substrate 2002. The conductive contacts 2010 may be coupled to conductive pathways 2012 through the package substrate 2002, allowing circuitry within the die 2006 to electrically couple to various ones of the conductive contacts 2014 or to the photonically steered antennas 100 (or to other devices included in the package substrate 2002, not shown). The first-level interconnects 2008 illustrated in FIG. 20 are solder bumps, but any suitable first-level interconnects 2008 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 2016 may be disposed between the die 2006 and the package substrate 2002 around the first-level interconnects 2008, and a mold compound 2018 may be disposed around the die 2006 and in contact with the package substrate 2002. In some examples, the underfill material 2016 may be the same as the mold compound 2018. Example materials that may be used for the underfill material 2016 and the mold compound 2018 are epoxy mold materials, as suitable. Second-level interconnects 2020 may be coupled to the conductive contacts 2014. The second-level interconnects 2020 illustrated in FIG. 20 are solder balls (e.g., for a ball grid array arrangement), but any suitable second-level interconnects 2020 may be used (e.g., pins in a pin grid array arrangement or lands in a land grid array arrangement). The second-level interconnects 2020 may be used to couple the IC package 2000 to another component, such as a circuit board (e.g., a motherboard), an interposer, or another IC package, as known in the art and as discussed below with reference to FIG. 21.

In FIG. 20, the IC package 2000 is a flip chip package, and includes a photonically steered antenna 100 in the package substrate 2002. The number and location of photonically steered antennas 100 in the package substrate 2002 of the IC package 2000 is simply illustrative, and any number of photonically steered antennas 100 (with any suitable structure) may be included in a package substrate 2002. In some examples, no photonically steered antenna 100 may be included in the package substrate 2002. The die 2006 may take the form of any of the examples of the die 2202 discussed herein (e.g., may include any of the examples of the IC device 1900). In some examples, the die 2006 may include one or more photonically steered antennas 100 (e.g., as discussed above with reference to FIG. 18 and FIG. 19); in other examples, the die 2006 may not include any photonically steered antenna 100.

Although the IC package 2000 illustrated in FIG. 20 is a flip chip package, other package architectures may be used. For example, the IC package 2000 may be a ball grid array (BGA) package, such as an embedded wafer-level ball grid array (eWLB) package. In another example, the IC package 2000 may be a wafer-level chip scale package (WLCSP) or a panel fanout (FO) package. Although a single die 2006 is illustrated in the IC package 2000 of FIG. 20, an IC package 2000 may include multiple dies 2006 (e.g., with one or more of the multiple dies 2006 coupled to photonically steered antennas 100 included in the package substrate 2002). An IC package 2000 may include additional passive components, such as surface-mount resistors, capacitors, and inductors disposed on the first face 2022 or the second face 2024 of the package substrate 2002. More generally, an IC package 2000 may include any other active or passive components known in the art.

Figure 21:
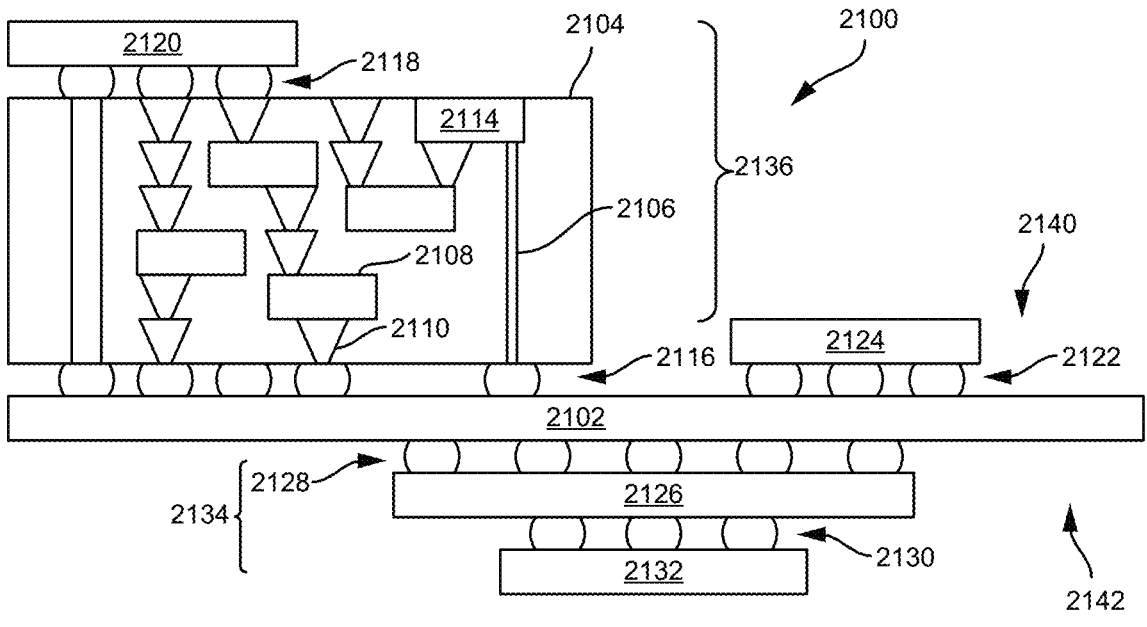
FIG. 21 is a cross-sectional side view of an IC device assembly that may include a photonic beam steering surface antenna, in accordance with any of the examples disclosed herein.

FIG. 21 is a cross-sectional side view of an IC device assembly 2100 that may include one or more IC packages or other electronic components (e.g., a die) including one or more photonically steered antennas 100, in accordance with any of the examples disclosed herein. The IC device assembly 2100 includes a number of components disposed on a circuit board 2102 (which may be, for example, a motherboard). The IC device assembly 2100 includes components disposed on a first face 2140 of the circuit board 2102 and an opposing second face 2142 of the circuit board 2102; generally, components may be disposed on one or both faces 2140 and 2142. Any of the IC packages discussed below with reference to the IC device assembly 2100 may take the form of any of the examples of the IC package 2000 discussed above with reference to FIG. 20 (e.g., may include one or more photonically steered antennas 100 in a package substrate 2002 or in a die).

In some examples, the circuit board 2102 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2102. In other examples, the circuit board 2102 may be a non-PCB substrate.

The IC device assembly 2100 illustrated in FIG. 21 includes a package-on-interposer structure 2136 coupled to the first face 2140 of the circuit board 2102 by coupling components 2116. The coupling components 2116 may electrically and mechanically couple the package-on-interposer structure 2136 to the circuit board 2102, and may include solder balls (as shown in FIG. 21), male and female portions of a socket, an adhesive, an underfill material, and/or any other suitable electrical and/or mechanical coupling structure.

The package-on-interposer structure 2136 may include an IC package 2120 coupled to an interposer 2104 by coupling components 2118. The coupling components 2118 may take any suitable form for the application, such as the forms discussed above with reference to the coupling components 2116. Although a single IC package 2120 is shown in FIG. 21, multiple IC packages may be coupled to the interposer 2104; indeed, additional interposers may be coupled to the interposer 2104. The interposer 2104 may provide an intervening substrate used to bridge the circuit board 2102 and the IC package 2120. The IC package 2120 may be or include, for example, a die (the die 2202 of FIG. 22), an IC device (e.g., the IC device 1900 of FIG. 19), or any other suitable component. Generally, the interposer 2104 may spread a connection to a wider pitch or reroute a connection to a different connection. For example, the interposer 2104 may couple the IC package 2120 (e.g., a die) to a set of BGA conductive contacts of the coupling components 2116 for coupling to the circuit board 2102. In the example illustrated in FIG. 21, the IC package 2120 and the circuit board 2102 are attached to opposing sides of the interposer 2104; in other examples, the IC package 2120 and the circuit board 2102 may be attached to a same side of the interposer 2104. In some examples, three or more components may be interconnected by way of the interposer 2104.

The interposer 2104 may be formed of an epoxy resin, a fiberglass-reinforced epoxy resin, an epoxy resin with inorganic fillers, a ceramic material, or a polymer material such as polyimide. In some examples, the interposer 2104 may be formed of alternate rigid or flexible materials that may include the same materials described above for use in a semiconductor substrate, such as silicon, germanium, and other group III-V and group IV materials. The interposer 2104 may include metal interconnects 2108 and vias 2110, including but not limited to through-silicon vias (TSVs) 2106. The interposer 2104 may further include embedded devices 2114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2104. The package-on-interposer structure 2136 may take the form of any of the package-on-interposer structures known in the art. In some examples, the interposer 2104 may include one or more photonically steered antennas 100.

The IC device assembly 2100 may include an IC package 2124 coupled to the first face 2140 of the circuit board 2102 by coupling components 2122. The coupling components 2122 may take the form of any of the examples discussed above with reference to the coupling components 2116, and the IC package 2124 may take the form of any of the examples discussed above with reference to the IC package 2120.

The IC device assembly 2100 illustrated in FIG. 21 includes a package-on-package structure 2134 coupled to the second face 2142 of the circuit board 2102 by coupling components 2128. The package-on-package structure 2134 may include a first IC package 2126 and a second IC package 2132 coupled together by coupling components 2130 such that the first IC package 2126 is disposed between the circuit board 2102 and the second IC package 2132. The coupling components 2128, 2130 may take the form of any of the examples of the coupling components 2116 discussed above, and the IC packages 2126, 2132 may take the form of any of the examples of the IC package 2120 discussed above. The package-on-package structure 2134 may be configured in accordance with any of the package-on-package structures known in the art.

Figure 22:
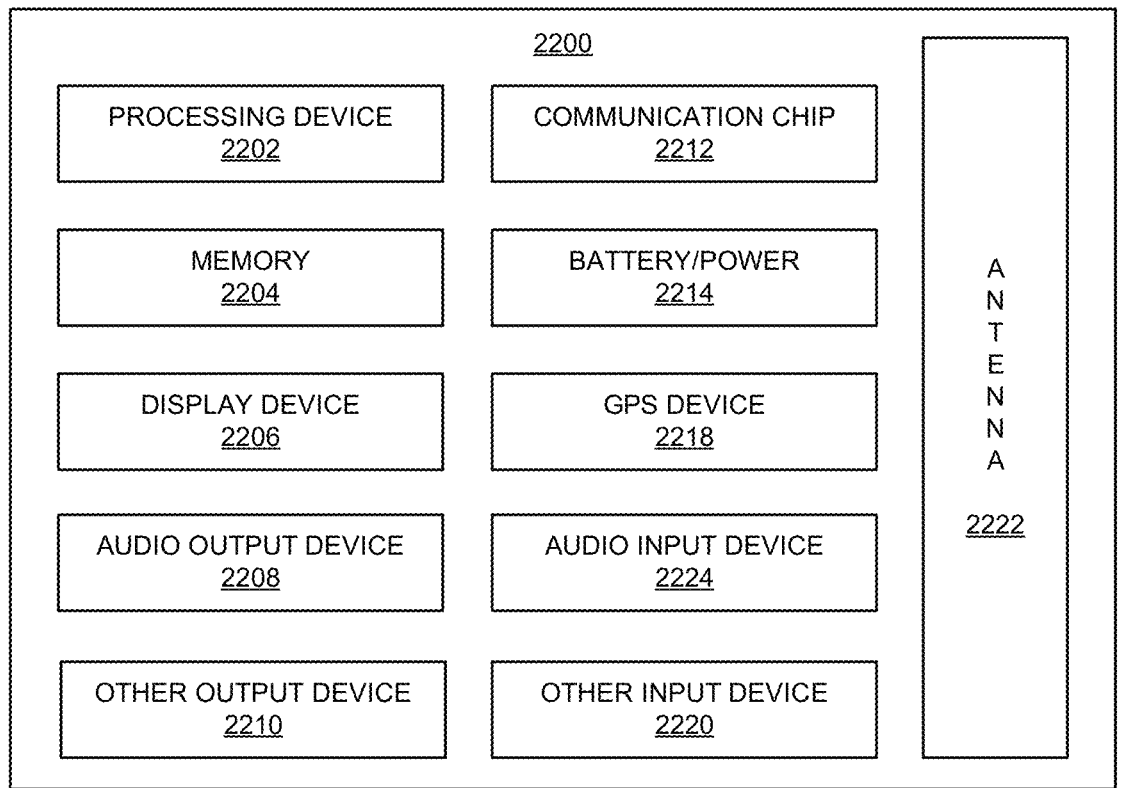
FIG. 22 is a block diagram of an example electrical device that may include a photonic beam steering surface antenna, in accordance with any of the examples disclosed herein.

FIG. 22 is a block diagram of an example electrical device 2200 that may include one or more photonically steered antennas 100, in accordance with any of the examples disclosed herein. For example, any suitable ones of the components of the electrical device 2200 may include one or more of the IC packages 2000, IC devices 1900, or dies 2202 disclosed herein. A number of components are illustrated in FIG. 22 as included in the electrical device 2200, but any one or more of these components may be omitted or duplicated, as suitable for the application. In some examples, some or all of the components included in the electrical device 2200 may be attached to one or more motherboards. In some examples, some or all of these components are fabricated onto a single system-on-a-chip (SoC) die.

Additionally, in various examples, the electrical device 2200 may not include one or more of the components illustrated in FIG. 22, but the electrical device 2200 may include interface circuitry for coupling to the one or more components. For example, the electrical device 2200 may not include a display device 2206, but may include display device interface circuitry (e.g., a connector and driver circuitry) to which a display device 2206 may be coupled. In another set of examples, the electrical device 2200 may not include an audio input device 2224 or an audio output device 2208, but may include audio input or output device interface circuitry (e.g., connectors and supporting circuitry) to which an audio input device 2224 or audio output device 2208 may be coupled.

The electrical device 2200 may include a processing device 2202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2202 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2200 may include a memory 2204, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2204 may include memory that shares a die with the processing device 2202. This memory may be used as cache memory and may include embedded dynamic random access memory (eDRAM) or spin transfer torque magnetic random access memory (STT-MRAM).

In some examples, the electrical device 2200 may include a communication chip 2212 (e.g., one or more communication chips). For example, the communication chip 2212 may be configured for managing wireless communications for the transfer of data to and from the electrical device 2200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2212 may operate in accordance with other wireless protocols in other examples.

The electrical device 2200 may include an antenna 2222 to facilitate wireless communications and/or to receive other wireless communications (such as AM or FM radio transmissions).

In some examples, the communication chip 2212 may manage wired communications, such as electrical, optical, or any other suitable communication protocols (e.g., the Ethernet). As noted above, the communication chip 2212 may include multiple communication chips. For instance, a first communication chip 2212 may be dedicated to shorter-range wireless communications such as Wi-Fi or Bluetooth, and a second communication chip 2212 may be dedicated to longer-range wireless communications such as global positioning system (GPS), EDGE, GPRS, CDMA, WiMAX, LTE, EV-DO, or others. In some examples, a first communication chip 2212 may be dedicated to wireless communications, and a second communication chip 2212 may be dedicated to wired communications.

The electrical device 2200 may include battery/power circuitry 2214. The battery/power circuitry 2214 may include one or more energy storage devices (e.g., batteries or capacitors) and/or circuitry for coupling components of the electrical device 2200 to an energy source separate from the electrical device 2200 (e.g., AC line power).

The electrical device 2200 may include a display device 2206 (or corresponding interface circuitry, as discussed above). The display device 2206 may include any visual indicators, such as a heads-up display, a computer monitor, a projector, a touchscreen display, a liquid crystal display (LCD), a light-emitting diode display, or a flat panel display.

The electrical device 2200 may include an audio output device 2208 (or corresponding interface circuitry, as discussed above). The audio output device 2208 may include any device that generates an audible indicator, such as speakers, headsets, or earbuds.

The electrical device 2200 may include an audio input device 2224 (or corresponding interface circuitry, as discussed above). The audio input device 2224 may include any device that generates a signal representative of a sound, such as microphones, microphone arrays, or digital instruments (e.g., instruments having a musical instrument digital interface (MIDI) output).

The electrical device 2200 may include a GPS device 2218 (or corresponding interface circuitry, as discussed above). The GPS device 2218 may be in communication with a satellite-based system and may receive a location of the electrical device 2200, as known in the art.

The electrical device 2200 may include any other output device 2210 (or corresponding interface circuitry, as discussed above). Examples of the other output device 2210 may include an audio codec, a video codec, a printer, a wired or wireless transmitter for providing information to other devices, or an additional storage device.

The electrical device 2200 may include any other input device 2220 (or corresponding interface circuitry, as discussed above). Examples of the other input device 2220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2200 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2200 may be any other electronic device that processes data.

Example methods, apparatus, systems, and articles of manufacture to enable photonic beam steering are disclosed herein. Further examples and combinations thereof include the following:

Example 1 includes an apparatus comprising a semiconductor substrate to be communicatively coupled to a radio frequency (RF) source, an at least partially transparent dielectric layer, the semiconductor substrate at a first side of the at least partially transparent dielectric layer, an at least partially transparent conductive film at a second side of the at least partially transparent dielectric layer that is opposite the first side, and an illumination source to illuminate at least a portion of the semiconductor substrate to generate a photoinduced solid-state plasma pattern that beam steers an RF signal corresponding to the RF source.

Example 2 includes the apparatus as defined in example 1, wherein the at least partially transparent conductive film is at least partially composed of indium tin oxide (ITO).

Example 3 includes the apparatus as defined in any of examples 1 or 2, wherein the illumination source includes a two dimensional grid of light emitting diodes (LEDs) controlled by control circuitry.

Example 4 includes the apparatus as defined in any of examples 1 to 3, wherein the illumination source includes a two-dimensional grid of lasers controlled by control circuitry or a laser with a programmable optical equalization device.

Example 5 includes the apparatus as defined in any of examples 1 to 4, wherein the at least partially transparent dielectric layer includes an IR transparent substrate.

Example 6 includes the apparatus as defined in example 5, wherein the RF source includes a radio frequency integrated circuit (RFIC) that is communicatively coupled to the semiconductor substrate by a via that extends through the IR transparent substrate.

Example 7 includes the apparatus as defined in any of examples 1 to 6, further including a restraint fixture to position the at least partially transparent dielectric layer relative to the illumination source.

Example 8 includes the apparatus as defined in any of examples 1 to 7, wherein the illumination source is to illuminate the at least the portion of the semiconductor substrate to define photoinduced patches of different sizes.

Example 9 includes an antenna comprising a semiconductor substrate, an at least partially transparent ground plane, and an at least partially transparent dielectric layer between the ground plane and the semiconductor substrate, wherein an optical light source is to emit light incident on the at least partially transparent ground plane to illuminate a portion of the semiconductor substrate to define a photoinduced solid-state plasma pattern to steer a radio frequency (RF) signal corresponding to an RF source communicatively coupled to the antenna.

Example 10 includes the antenna as defined in example 9, further including an illumination source.

Example 11 includes the antenna as defined in example 10, wherein the illumination source includes a two-dimensional grid of light sources controlled by control circuitry to vary illumination across the semiconductor substrate and define patches of differing impedance of the semiconductor substrate.

Example 12 includes the antenna as defined in any of examples 9 to 11, wherein the at least partially transparent dielectric layer includes glass.

Example 13 includes the antenna as defined in example 12, further including a glass through via that extends through the glass, the glass through via to communicatively couple the RF source to the photoinduced solid-state plasma pattern.

Example 14 includes the antenna as defined in any of examples 9 to 13, wherein the at least partially transparent ground plane includes indium tin oxide (ITO).

Example 15 includes a non-transitory machine readable storage medium comprising instructions that, when executed, cause processor circuitry to at least cause a radio frequency integrated circuit (RFIC) to provide a radio frequency (RF) signal to a semiconductor substrate, the semiconductor substrate coupled to an at least partially transparent dielectric layer at a first side of the at least partially transparent dielectric layer, an at least partially transparent conductive film at a second side of the at least partially transparent dielectric layer that is opposite the first side, and cause an illumination source to illuminate at least a portion of the semiconductor substrate to photoinduce a solid-state plasma pattern of the semiconductor substrate to beam steer the RF signal.

Example 16 includes the non-transitory machine readable storage medium as defined in example 15, wherein the instructions cause the processor circuitry to determine a pattern of the illumination source based on a beam steering setting.

Example 17 includes the non-transitory machine readable storage medium as defined in example 16, wherein the pattern of the illumination source is determined based on a phase of the signal.

Example 18 includes the non-transitory machine readable storage medium as defined in any of examples 16 or 17, wherein the pattern defines first pixels of the illumination source that emit light and second pixels of the illumination source that are not to emit light.

Example 19 includes the non-transitory machine readable storage medium as defined in any of examples 16 to 18, wherein the pattern generally resembles a wave pattern.

Example 20 includes the non-transitory machine readable storage medium as defined in any of examples 16 to 19, wherein instructions cause the processor circuitry to determine a pixelization pattern of the semiconductor substrate corresponding to the beam steering thereof.

Example 21 includes a method comprising providing a radio frequency (RF) signal to a semiconductor substrate, the semiconductor substrate at a first side of an at least partially transparent dielectric layer, an at least partially transparent conductive film at a second side of the at least partially transparent dielectric layer that is opposite the first side, and emitting, via an illumination source, light toward at least a portion of the semiconductor substrate to photoinduce a solid-state plasma pattern of the semiconductor substrate to beam steer the RF signal.

Example 22 includes the method as defined in example 21, further including varying a pattern of the emitted light toward the semiconductor substrate to vary the beam steering of the RF signal.

Example 23 includes the method as defined in any of examples 21 or 22, further including varying an amount of the semiconductor substrate illuminated by the illumination source to control the beam steering of the RF signal.

From the foregoing, it will be appreciated that example systems, methods, apparatus, and articles of manufacture have been disclosed that enable optical-based beam steering surface antennas that can effectively control RF parameters of signals transmitted therefrom. Examples disclosed herein can also enable cost-effective and reliable devices for beam steering adjustment. Further, examples disclosed herein do not require tight tolerances, as seen in known beam steering implementations. Examples disclosed herein can also reduce (e.g., eliminate) insertion losses typically seen in known implementations.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:
a semiconductor substrate to be communicatively coupled to a radio frequency (RF) source, the RF source including a radio frequency integrated circuit (RFIC);
an at least partially transparent dielectric layer, the semiconductor substrate at a first side of the at least partially transparent dielectric layer;
an at least partially transparent conductive film at a second side of the at least partially transparent dielectric layer that is opposite the first side; and
an illumination source to illuminate at least a portion of the semiconductor substrate to generate a photoinduced solid-state plasma pattern that beam steers an RF signal corresponding to the RF source.

2. The apparatus as defined in claim 1, wherein the at least partially transparent conductive film is at least partially composed of indium tin oxide (ITO).

3. The apparatus as defined in claim 1, wherein the illumination source includes a two dimensional grid of light emitting diodes (LEDs) controlled by control circuitry.

4. The apparatus as defined in claim 1, wherein the illumination source includes a two-dimensional grid of lasers controlled by control circuitry or a laser with a programmable optical equalization device.

5. The apparatus as defined in claim 1, wherein the at least partially transparent dielectric layer includes an IR transparent substrate.

6. The apparatus as defined in claim 5, wherein the RFIC is communicatively coupled to the semiconductor substrate by a via that extends through the IR transparent substrate.

7. The apparatus as defined in claim 1, including a restraint fixture to position the at least partially transparent dielectric layer relative to the illumination source.

8. The apparatus as defined in claim 1, wherein the illumination source is to illuminate the at least the portion of the semiconductor substrate to define photoinduced patches of different sizes.

9. An antenna comprising:
a semiconductor substrate;
an at least partially transparent ground plane; and
an at least partially transparent dielectric layer between the ground plane and the semiconductor substrate, wherein an optical light source is to emit light incident on the at least partially transparent ground plane to illuminate a portion of the semiconductor substrate to define a photoinduced solid-state plasma pattern to steer a radio frequency (RF) signal corresponding to an RF source communicatively coupled to the antenna, the RF source including a radio frequency integrated circuit (RFIC).

10. The antenna as defined in claim 9, including an illumination source.

11. The antenna as defined in claim 10, wherein the illumination source includes a two-dimensional grid of light sources controlled by control circuitry to vary illumination across the semiconductor substrate and define patches of differing impedance of the semiconductor substrate.

12. The antenna as defined in claim 9, wherein the at least partially transparent dielectric layer includes glass.

13. The antenna as defined in claim 12, including a through-glass via that extends through the glass, the through-glass via to communicatively couple the RF source to the photoinduced solid-state plasma pattern.

14. The antenna as defined in claim 9, wherein the at least partially transparent ground plane includes indium tin oxide (ITO).

15. A non-transitory machine readable storage medium comprising instructions to cause at least one processor circuit to at least:
cause a radio frequency integrated circuit (RFIC) to provide a radio frequency (RF) signal to a semiconductor substrate, the semiconductor substrate coupled to an at least partially transparent dielectric layer at a first side of the at least partially transparent dielectric layer, an at least partially transparent conductive film at a second side of the at least partially transparent dielectric layer that is opposite the first side; and
cause an illumination source to illuminate at least a portion of the semiconductor substrate to photoinduce a solid-state plasma pattern of the semiconductor substrate to beam steer the RF signal.

16. The non-transitory machine readable storage medium as defined in claim 15, wherein the instructions cause one or more of the at least one processor circuit to determine a pattern of the illumination source based on a beam steering setting.

17. The non-transitory machine readable storage medium as defined in claim 16, wherein the pattern of the illumination source is determined based on a phase of the signal.

18. The non-transitory machine readable storage medium as defined in claim 16, wherein the pattern defines first pixels of the illumination source that emit light and second pixels of the illumination source that are not to emit light.

19. The non-transitory machine readable storage medium as defined in claim 16, wherein the pattern generally resembles a wave pattern.

20. The non-transitory machine readable storage medium as defined in claim 16, wherein the instructions cause one or more the at least one processor circuit to determine a pixelization pattern of the semiconductor substrate corresponding to the beam steering thereof.

21. A method comprising:
providing, via a radio frequency integrated circuit (RFIC), a radio frequency (RF) signal to a semiconductor substrate, the semiconductor substrate at a first side of an at least partially transparent dielectric layer, an at least partially transparent conductive film at a second side of the at least partially transparent dielectric layer that is opposite the first side; and emitting, via an illumination source, light toward at least a portion of the semiconductor substrate to photoinduce a solid-state plasma pattern of the semiconductor substrate to beam steer the RF signal.

22. The method as defined in claim 21, including varying a pattern of the emitted light toward the semiconductor substrate to vary the beam steering of the RF signal.

23. The method as defined in claim 21, including varying an amount of the semiconductor substrate illuminated by the illumination source to control the beam steering of the RF signal.

\* \* \* \* \*